(12) United States Patent
Lim et al.

(10) Patent No.: US 12,174,341 B2
(45) Date of Patent: Dec. 24, 2024

(54) ANTI-REFLECTIVE FILM AND DISPLAY DEVICE INCLUDING THE SAME

(71) Applicant: Samsung Display Co., Ltd., Yongin-si (KR)

(72) Inventors: Ho Lim, Suwon-si (KR); Taemin Kim, Hwaseong-si (KR); Bongsung Seo, Suwon-si (KR); Donggeun Shin, Hwaseong-si (KR); Gihoon Yang, Asan-si (KR); Seulgee Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 268 days.

(21) Appl. No.: 17/229,193

(22) Filed: Apr. 13, 2021

(65) Prior Publication Data

US 2021/0341649 A1 Nov. 4, 2021

(30) Foreign Application Priority Data

Apr. 29, 2020 (KR) .................. 10-2020-0052771
Dec. 2, 2020 (KR) .................. 10-2020-0167019

(51) Int. Cl.
| | | |
|---|---|---|
| *G02B 1/11* | (2015.01) | |
| *B32B 7/12* | (2006.01) | |
| *B32B 27/28* | (2006.01) | |
| *C09D 183/14* | (2006.01) | |
| *G02B 1/14* | (2015.01) | |
| *H10K 50/86* | (2023.01) | |
| *H10K 59/38* | (2023.01) | |
| *H10K 102/00* | (2023.01) | |

(52) U.S. Cl.
CPC .................. *G02B 1/11* (2013.01); *B32B 7/12* (2013.01); *B32B 27/283* (2013.01); *C09D 183/14* (2013.01); *G02B 1/14* (2015.01); *H10K 50/86* (2023.02); *B32B 2255/10* (2013.01); *B32B 2255/26* (2013.01); *B32B 2307/40* (2013.01); *B32B 2307/536* (2013.01); *B32B 2457/20* (2013.01); *H10K 59/38* (2023.02); *H10K 2102/331* (2023.02)

(58) Field of Classification Search
None
See application file for complete search history.

(56) References Cited

U.S. PATENT DOCUMENTS

| | | |
|---|---|---|
| 8,137,801 B2 | 3/2012 | Walker, Jr. et al. |
| 9,606,267 B2 | 3/2017 | Yang et al. |
| 10,768,342 B2 | 9/2020 | Kim et al. |

(Continued)

FOREIGN PATENT DOCUMENTS

| | | | |
|---|---|---|---|
| CN | 108027451 A | * 5/2018 | ............ C08F 283/06 |
| JP | 2012-183452 | 9/2012 | |

(Continued)

*Primary Examiner* — Anthony J Frost
(74) *Attorney, Agent, or Firm* — KILE PARK REED & HOUTTEMAN PLLC

(57) ABSTRACT

An anti-reflective film includes a hard coating layer including a curable resin, and a low-refractive layer disposed on the hard coating layer and including the curable resin, wherein a pencil hardness measured on the low-refractive layer is equal to or greater than 3H, thereby achieving excellent durability and anti-reflective effects. Also, provided is a display device employing the anti-reflective film.

18 Claims, 8 Drawing Sheets

(56) References Cited

U.S. PATENT DOCUMENTS

| | | | | |
|---|---|---|---|---|
| 2007/0123133 A1* | 5/2007 | Winters | ................ | H10K 71/00 |
| | | | | 445/24 |
| 2009/0052041 A1 | 2/2009 | Watanabe et al. | | |
| 2010/0196687 A1 | 8/2010 | Isono et al. | | |
| 2012/0135210 A1* | 5/2012 | Walker, Jr. | .............. | G02B 1/111 |
| | | | | 977/773 |
| 2012/0225211 A1* | 9/2012 | Kuniyasu | ................ | G02B 1/111 |
| | | | | 427/385.5 |
| 2013/0273354 A1* | 10/2013 | Horio | ........................ | G02B 1/14 |
| | | | | 428/331 |
| 2017/0174938 A1* | 6/2017 | Shin | ......................... | C08J 7/043 |
| 2019/0165283 A1 | 5/2019 | Boudreault et al. | | |
| 2019/0258098 A1* | 8/2019 | Oba | .......................... | F21S 2/00 |
| 2021/0341649 A1 | 11/2021 | Lim et al. | | |

FOREIGN PATENT DOCUMENTS

| | | | | |
|---|---|---|---|---|
| JP | 5076729 | | 11/2012 | |
| KR | 10-0858049 | | 9/2008 | |
| KR | 10-2009-0018951 | | 2/2009 | |
| KR | 10-2011-0024984 | | 3/2011 | |
| KR | 10-1526649 | | 6/2015 | |
| KR | 10-2015-0105611 | | 9/2015 | |
| KR | 20150105611 A | * | 10/2015 | .............. C09D 7/40 |
| KR | 10-1959510 | | 3/2019 | |
| KR | 10-2019-0064478 | | 6/2019 | |
| KR | 10-2021-0134206 | | 11/2021 | |

\* cited by examiner

ANTI-REFLECTIVE FILM AND DISPLAY DEVICE INCLUDING THE SAME

CROSS-REFERENCE TO RELATED APPLICATION(S)

This application claims priority to and benefits of Korean Patent Application Nos. 10-2020-0052771 and 10-2020-0167019 under 35 U.S.C. § 119, filed on Apr. 29, 2020 and Dec. 2, 2020, respectively, in the Korean Intellectual Property Office, the entire contents of which are incorporated herein by reference.

BACKGROUND

1. Technical Field

The disclosure herein relates to a display device including an anti-reflective film disposed on a display panel or directly coated on a display panel.

2. Description of the Related Art

Various types of display devices are used for providing images. The exteriors of such display devices are required to have high surface hardness and impact resistance so as to protect the display device from external environments and have reliability even with repeated use.

In case that the display devices are exposed to external light sources such as various lightings and natural light, images produced by the display devices may not be clearly delivered to a user, or eye fatigue or headaches may be induced on a user. In this respect, there is a strong requirement for anti-reflection properties in a display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an anti-reflective film having excellent surface hardness and anti-reflective properties.

The disclosure provides a display device including an anti-reflective film having high hardness, excellent anti-reflective properties, and excellent durability and visibility.

In an embodiment of the inventive concept, an anti-reflective film may include a hard coating layer including a curable resin, and a low-refractive layer disposed on the hard coating layer and including the curable resin, wherein a pencil hardness measured on the low-refractive layer may be equal to or greater than 3H.

In an embodiment, the low-refractive layer may include a first nanoparticle having a size in a range of about 40 nm to about 100 nm.

In an embodiment, the hard coating layer may have a refractive index in a range of about 1.45 to about 1.6, the low-refractive layer may have a refractive index in a range of about 1.25 to about 1.45, and the refractive index of the hard coating layer may be greater than the refractive index of the low-refractive layer.

In an embodiment, the first nanoparticle may be at least one of a hollow silica, a hollow acrylate polymer, a hollow vinyl polymer and a hollow epoxy polymer.

In an embodiment, the anti-reflective film may further include a high-refractive layer disposed between the hard coating layer and the low-refractive layer, wherein the high-refractive layer may include the curable resin and a second nanoparticle having a size in a range of about 10 nm to about 30 nm.

In an embodiment, the high-refractive layer may have a refractive index in a range of about 1.6 to about 1.75, and the refractive index of the high-refractive layer may be greater than the refractive index of the hard coating layer and greater than the refractive index of the low-refractive layer.

In an embodiment, the second nanoparticle may include at least one of $C_{60}$ (fullerene), $TiO_2$, $ZnO$, $SiC$, $GaP$, $Ag$, $ZrO_2$, and $Au$.

In an embodiment, the low-refractive layer and the hard coating layer may have a same refractive index.

In an embodiment, the anti-reflective film may further include a functional layer disposed on the low-refractive layer, the functional layer including a fluorine-containing compound.

In an embodiment, the curable resin may include polysilsesquioxane.

In an embodiment, the polysilsesquioxane may be represented by at least one of Formula 1 to Formula 4 below.

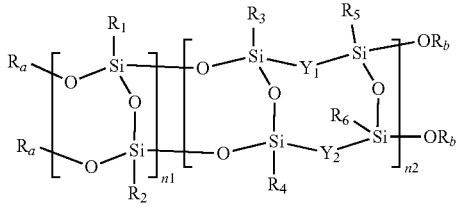

[Formula 1]

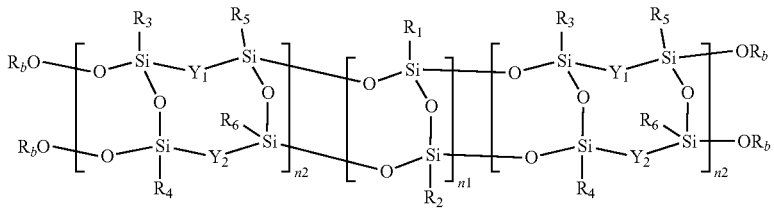

[Formula 2]

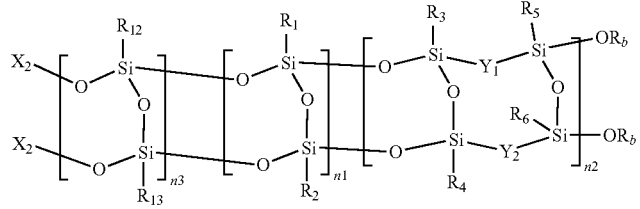

[Formula 3]

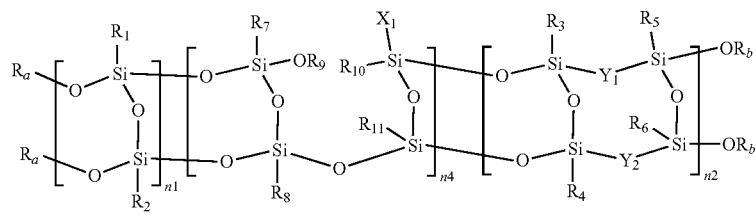

[Formula 4]

In Formula 1 to Formula 4, $Y_1$ and $Y_2$ may each independently be O, $NR_{20}$, or $[(SiO_{3/2}R_{21})_{4+2n}O]$, at least one of $Y_1$ and $Y_2$ may be $[(SiO_{3/2}R_{21})_{4+2n}O]$, $X_1$ and $X_2$ may each independently be $R_{22}$ or $[(SiO_{3/2}R_{23})_{4+2n}O]$, at least one of $X_1$ and $X_2$ may be $[(SiO_{3/2}R_{23})_{4+2n}O]$, $R_{20}$ to $R_{23}$ may each independently be a substituted or unsubstituted alkyl group of 1 to 12 carbon atoms, n and n' may each independently be an integer from 1 to 20, $R_a$ to $R_c$ may each independently be a substituted or unsubstituted alkyl group of 1 to 12 carbon atoms, n1 and n2 may each independently be an integer from 1 to 100,000, n3 may be 1 or 2, n4 may be an integer from 1 to 500, $R_1$ to $R_{13}$ may each independently be a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbo atoms, and $R_1$ and $R_{12}$ may be different from each other.

In an embodiment, the polysilsesquioxane may be represented by at least one of Formula 5 to Formula 7 below.

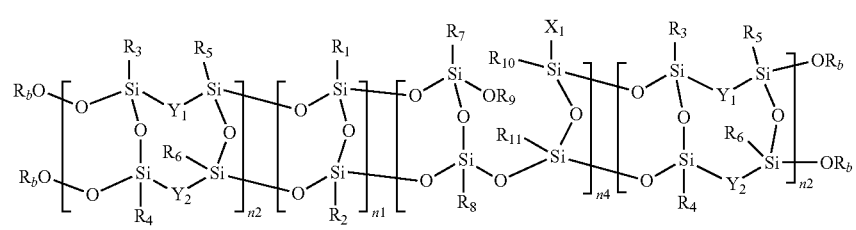

[Formula 5]

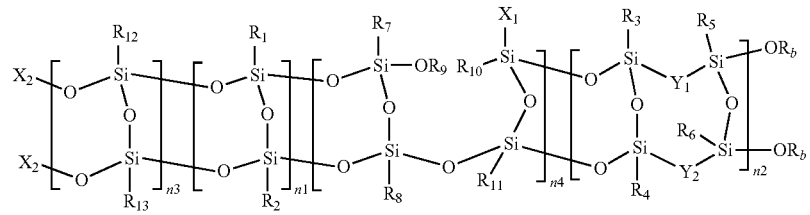

[Formula 6]

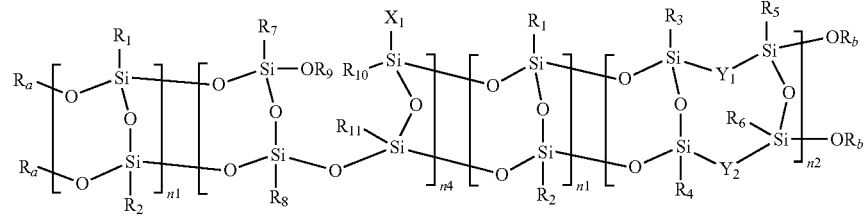

[Formula 7]

In Formula 5 to Formula 7, $Y_1$ and $Y_2$ each independently be O, $NR_{20}$, or $[(SiO_{3/2}R_{21})_{4+2n}O]$, at least one of $Y_1$ and $Y_2$ may be $[(SiO_{3/2}R_{21})_{4+2n}O]$, $X_1$ and $X_2$ may each independently be $R_{22}$ or $[(SiO_{3/2}R_{23})_{4+2n}O]$, at least one $X_1$ and $X_2$ are ay be $[(SiO_{3/2}R_{23})_{4+2n}O]$, $R_{20}$ to $R_{23}$ may each independently be a substituted or unsubstituted alkyl group of 1 to 12 carbon atoms, n and n' may each independently be an integer from 1 to 20, $R_a$ to $R_c$ may each independently be a substituted or unsubstituted alkyl group of 1 to 12 carbon atoms, n1 and n2 may each independently be an integer from 1 to 100,000, n3 may be 1 or 2, n4 may be an integer from 1 to 500, $R_1$ to $R_{13}$ may each independently be a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms, and $R_1$ and $R_{12}$ may be different from each other.

In an embodiment, the polysilsesquioxane may be represented by at least one of Formula 8 to Formula 9 below.

aryl group of 6 to 12 carbon atoms, or a substituted or unsubstituted heteroaryl group of 2 to 12 carbon atoms, and $R_1$ and $R_{12}$ may be different from each other.

In another embodiment of the inventive concept, a display device may include a display panel, and an anti-reflective film disposed on the display panel, wherein the anti-reflective film may include a hard coating layer including a curable resin, and a low-refractive layer disposed on the hard coating layer and including the curable resin, and a pencil hardness measured on the low-refractive layer is equal to or greater than 3H.

In an embodiment, the low-refractive layer may include a first nanoparticle having a size in a range of about 40 nm to about 100 nm.

In an embodiment, the anti-reflective film may further include a high-refractive layer disposed between the hard coating layer and the low-refractive layer, and the high-refractive layer may include the curable resin and a second nanoparticle having a size in a range of about 10 nm to about 30 nm.

In an embodiment, the display device may further include a light converting layer disposed between the display panel and the anti-reflective film and may include at least one light controlling part including a quantum dot.

[Formula 8]

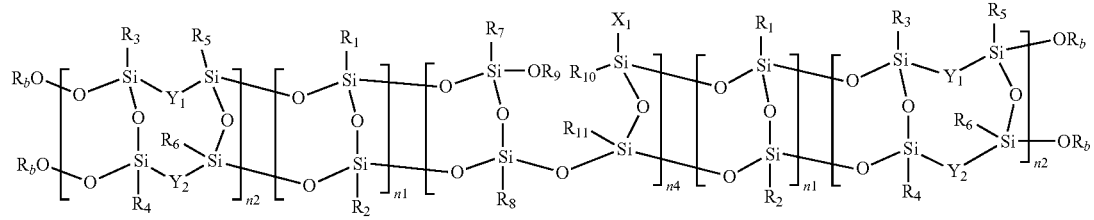

[Formula 9]

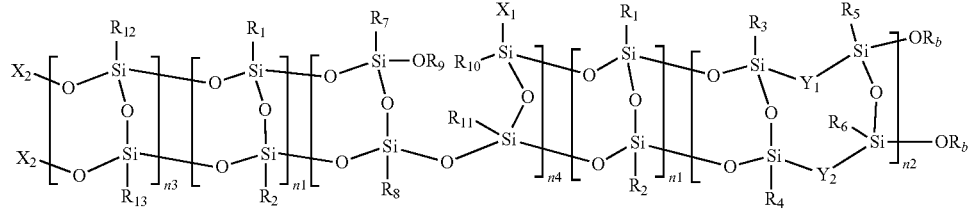

In Formula 8 and Formula 9, $Y_1$ and $Y_2$ may each independently be O, $NR_{20}$, or $[(SiO_3\ 2R_{21})_{4+2n}O]$, at least one of $Y_1$ and $Y_2$ may be $[(SiO_3\ 2R_{21})_{4+2n}O]$, $X_1$ and $X_2$ may each independently be $R_{22}$ or $[(SiO_{3/2}R_{23})_{4+2n}O]$, at least one of $X_1$ and $X_2$ may be $[(SiO_{3/2}R_{23})_{4+2n}O]$, $R_{20}$ to $R_{23}$ may each independently be a substituted or unsubstituted alkyl group of 1 to 12 carbon atoms, n and n' may each independently be an integer from 1 to 20, $R_a$ to $R_c$ may each independently be a substituted or unsubstituted alkyl group of 1 to 12 carbon atoms, n1 and n2 may each independently be an integer from 1 to 100,000, n3 may be 1 or 2, n4 may be an integer from 1 to 500, $R_1$ to $R_{13}$ may each independently be a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted In an embodiment, the display panel may include a light emitting device generating first light, and the light converting layer may include a first light controlling part transmitting the first light, a second light controlling part converting the first light into second light, and a third light controlling part converting the first light into third light.

In an embodiment, the display device may further include a color filter layer disposed on the light converting layer, and the color filter layer may include a first filter transmitting the first light, a second filter transmitting the second light, and a third filter transmitting the third light.

In an embodiment, the display device may further include an organic layer disposed on the color filter layer and providing a planar top surface.

In an embodiment, the anti-reflective film may be directly applied and formed on the organic layer.

In another embodiment of the inventive concept, a tiling display device may include display modules disposed along a first direction and a second direction intersecting the first direction, wherein each of the display modules may include a display panel and an anti-reflective film disposed on the display panel, the anti-reflective film may include a hard coating layer including a curable resin, and a low-refractive layer disposed on the hard coating layer and including the curable resin, and a pencil hardness measured on the low-refractive layer may be equal to or greater than 3H.

BRIEF DESCRIPTION OF THE DRAWINGS

The accompanying drawings are included to provide a further understanding of the inventive concept and are incorporated in and constitute a part of this specification. The drawings illustrate embodiments of the inventive concept and, together with the description, serve to explain principles of the inventive concept. The above and other aspects and features of the disclosure will become more apparent by describing in detail embodiments thereof with reference to the attached drawings, in which.

DETAILED DESCRIPTION OF THE EMBODIMENTS

Figure 1:
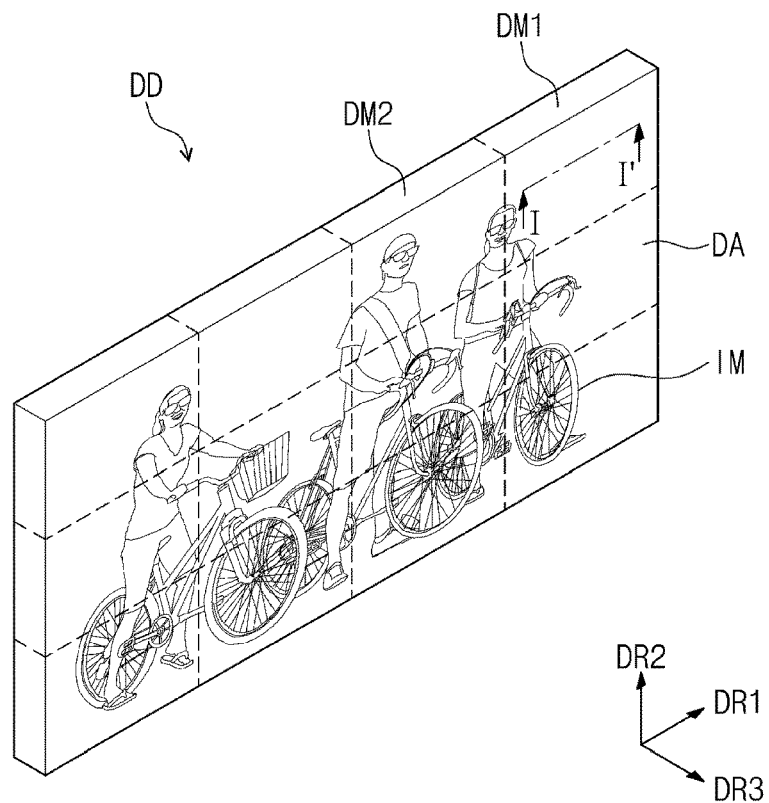
FIG. 1 is a perspective view of a display device according to an embodiment.

The inventive concept may have various modifications and may be embodied in different forms, and embodiments will be explained with reference to the accompanying drawings. The inventive concept may, however, be embodied in different forms and should not be construed as limited to the embodiments set forth herein. Rather, all modifications, equivalents, and substituents which are included in the spirit and technical scope of the inventive concept should be included in the inventive concept.

In the description, it will be understood that when an element (or region, layer, part, etc.) is referred to as being "on", "connected to" or "coupled to" another element, it can be directly on, connected to, or coupled to the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

Like reference numerals refer to like elements throughout. In the drawings, the thicknesses, ratios, and dimensions of elements may be exaggerated for effective explanation of technical contents.

As used herein, the expressions used in the singular such as "a," "an," and "the" are intended to include the plural forms as well, unless the context clearly indicates otherwise.

As used herein, the term "and/or"includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first," "second," etc. may be used herein to describe various elements, these elements should not be limited by these terms. These terms are only used to distinguish one element from another element. Thus, a first element could be termed a second element without departing from the teachings of the invention. Similarly, a second element could be termed a first element, without departing from the scope of the embodiments of the inventive concept.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, an anti-reflective film and a display device including the same according to an embodiment of the inventive concept will be explained with reference to attached drawings.

Hereinafter, embodiments of the inventive concept will be explained with reference to attached drawings.

Figure 2:
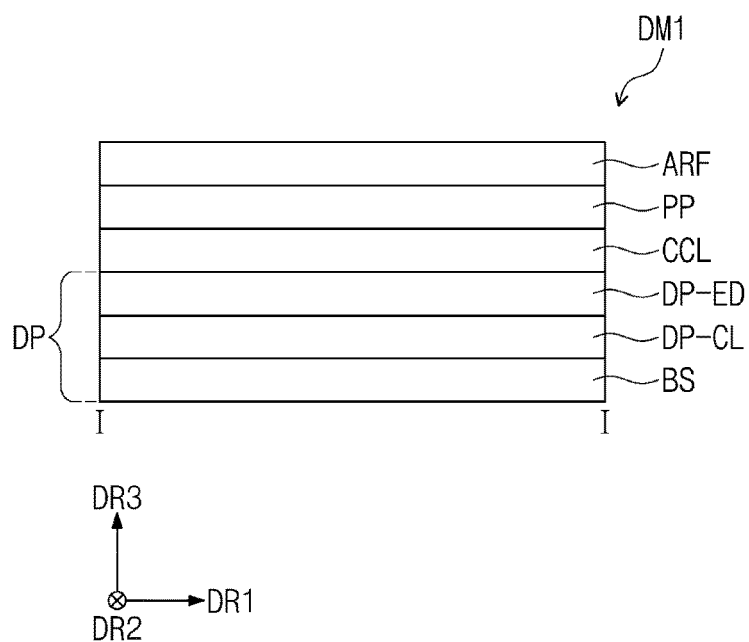
FIG. 2 is a schematic cross-sectional view of a display device according to an embodiment.

FIG. 1 is a perspective view showing a display device. FIG. 2 is a schematic cross-sectional view of a display device according to an embodiment. FIG. 2 is a schematic cross-sectional view showing a part corresponding to line I-I' in FIG. 1.

A display device DD may be a device which may be activated by electrical signals. The display device DD may include various embodiments. For example, the display device DD may be a large-sized electronic device such as a television, a monitor, and an external billboard. The display device DD of an embodiment may be a tiling display including multiple display modules DM1 and DM2. However, an embodiment of the inventive concept is not limited thereto, and the display device DD may include only one display module DM1. The explanation on a display module DM, which will be explained later, may be applied to each of the multiple modules DM1 and DM2.

In the display device DD of an embodiment, multiple display modules DM1 and DM2 may be disposed parallel to each other on a plane. The edge at one side of the display modules DM1 and DM2 may contact each other.

The display device DD may include a display area DA on which images IM are displayed. The display area on which the images I are displayed may be in parallel to a plane defined by a first directional axis DR1 and a second directional axis DR2 crossing the first directional axis DR1. The display device DD of an embodiment may include a display area DA but may not include a non-display area.

The display device DD may have a three-dimensional shape having a thickness in a third directional axis DR3 which is perpendicular to the plane defined by the first directional axis DR1 and the second directional axis DR2 crossing the first directional axis DR1. In the description, the top surface (or front surface) and bottom surface (or rear surface) of each member are defined based on the direction where the images are displayed on the display areas DA. The top surface and the bottom surface are opposite to each other based on the third directional axis DR3, and the normal lines of the top surface and the bottom surface may be in parallel to the third directional axis DR3. The directions indicated by the first to third directional axes DR1, DR2, and DR3 have a relative concept and may be changed into other directions. Hereinafter, the first to third directions are directions indicated by the first to third directional axes DR1, DR2, and DR3, respectively, and the same symbols of the drawings are referred to.

The display device DD according to an embodiment includes an anti-reflective film ARF, and a display panel DP. The anti-reflective film ARF may be disposed on the display panel DP. Although not shown, an adhesive layer may be further included between the anti-reflective film ARF and the display panel DP.

The display panel DP may be activated by electrical signals. In this embodiment, the display panel DP may be activated and display images IM on the display area DA of the display device DD, and a user may receive information through the images IM. However, these are only illustrations, and the display panel DP may be activated and sense external input applied to the top surface. The external input may include the touch of a user, the contact or access of an immaterial being, pressure, light, or heat, and an embodiment of the inventive concept is not limited to any one thereof.

The display panel DP may be a light-emitting type display panel. For example, the display panel DP may be a light-emitting diode (LED) display panel, an organic electroluminescence display panel, or a quantum dot light-emitting display panel. However, an embodiment of the inventive concept is not limited thereto. The display panel DP may provide first light. For example, the display panel DP may emit blue light.

The light-emitting diode (LED) display panel may include a light-emitting diode, the emission layer of the organic electroluminescence device display panel may include an organic electroluminescence material, and the emission layer of the quantum dot light-emitting display panel may include a quantum dot or a quantum rod. Hereinafter, the display panel DP included in the display device DD of an embodiment in the description will be explained as an organic electroluminescence display panel. However, an embodiment of the inventive concept is not limited thereto.

The display panel DP according to an embodiment may include a base substrate BS, a circuit layer DP-CL disposed on the base substrate BS, and a display device layer DP-ED disposed on the circuit layer DP-CL.

The base substrate BS may have an alternately stacked structure of an organic insulating layer including an organic material and an inorganic insulating layer including an inorganic material. Accordingly, the base layer BS may be flexible. However, an embodiment of the inventive concept is not limited thereto, and the base substrate BS may be rigid or provided as a single layer, but is not limited to any one thereof.

The circuit layer DP-CL may be disposed on the base substrate BS and may include multiple transistors. The circuit layer DP-CL may include driving transistors and switching transistors for driving the light emitting device ED (FIG. 8) of the display device layer DP-ED. The circuit layer DP-CL may include multiple insulating layers.

Figure 8:
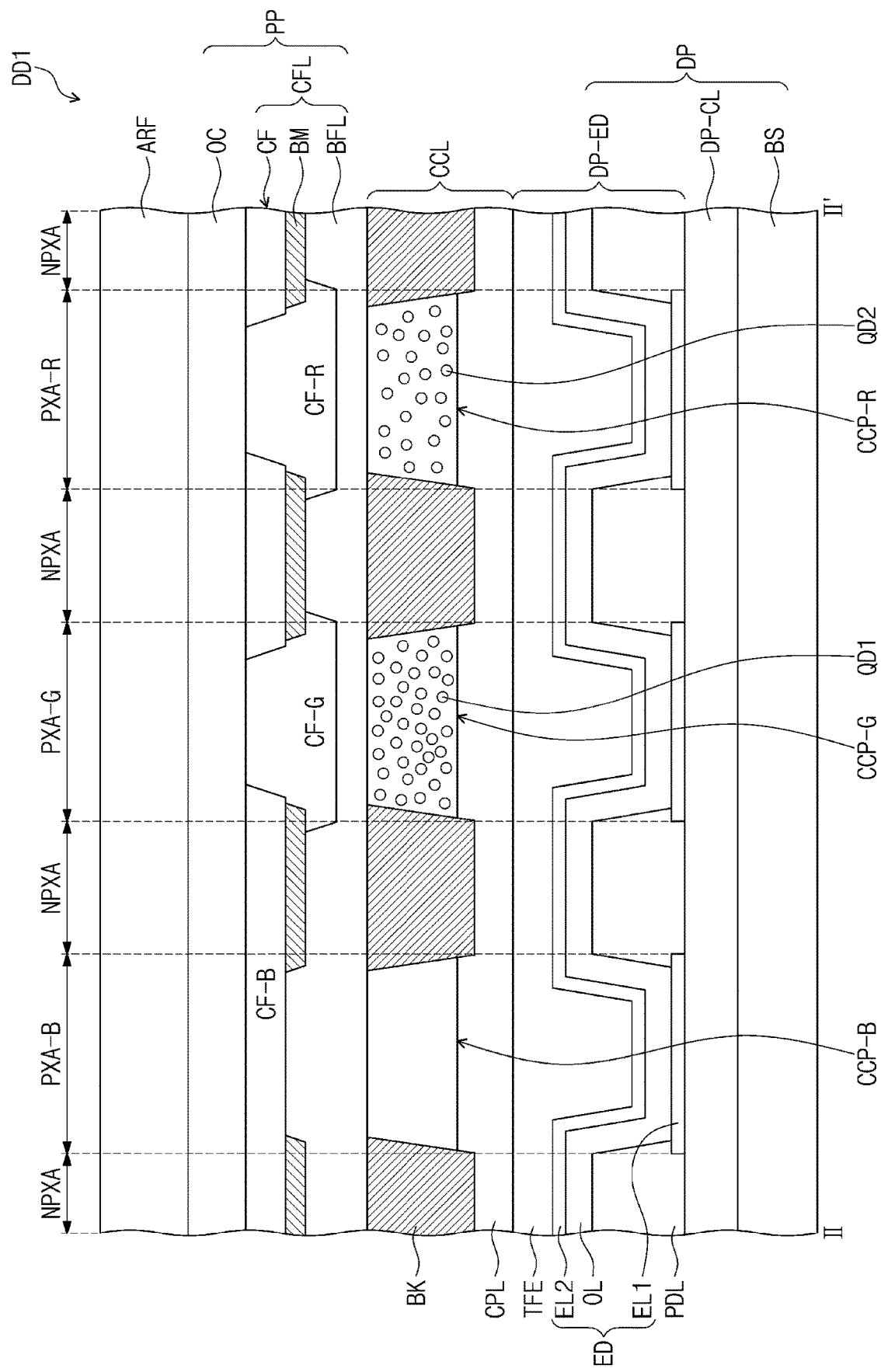
FIG. 8 is a schematic cross-sectional view of a display device according to an embodiment.

The display device layer DP-ED may be disposed on the circuit layer DP-CL and electrically connected with the circuit layer DP-CL for receiving signals. The display device layer DP-ED may include multiple light emitting devices ED (FIG. 8). The type of the light emitting device is not limited but may include, for example, an organic light emitting device, a quantum dot light emitting device, a liquid crystal capacitor, an electrophoretic device, or an electrowetting device.

The display device DD according to an embodiment may further include a light converting layer CCL and/or an optical layer PP, disposed on the display panel DP. The light converting layer CCL may selectively convert the wavelength of light generated in the display device layer DP-ED. The light converting layer CCL may include a light controlling part controlling the wavelength of light and including a quantum dot. The optical layer PP may be disposed on the display panel DP and control reflected light by external light at the display panel DP. For example, the optical layer PP may include a polarization layer and/or a color filter layer. Different from the drawings, the light converting layer CCL and/or the optical layer PP may be omitted from the display device DD of an embodiment.

Figure 3A:
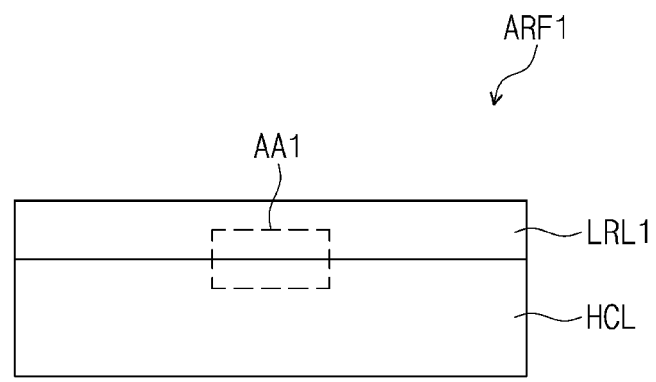
FIG. 3A is a schematic cross-sectional view showing an anti-reflective film according to an embodiment.
Figure 3B:
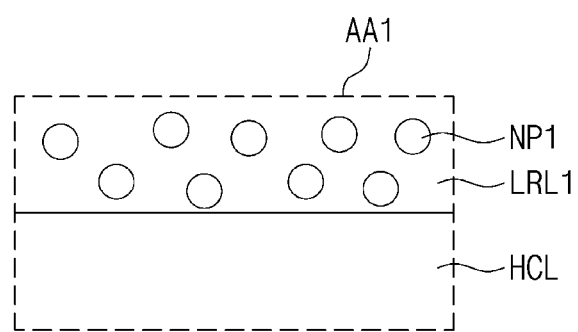
FIG. 3B is an enlarged view of section AA1 in FIG. 3A.
Figure 4A:
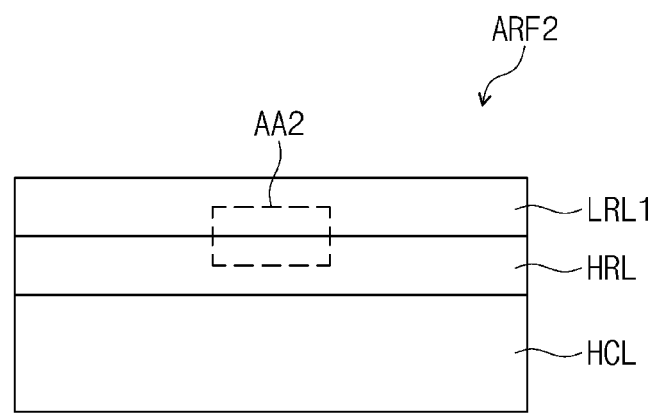
FIG. 4A is a schematic cross-sectional view showing an anti-reflective film according to an embodiment.
Figure 4B:
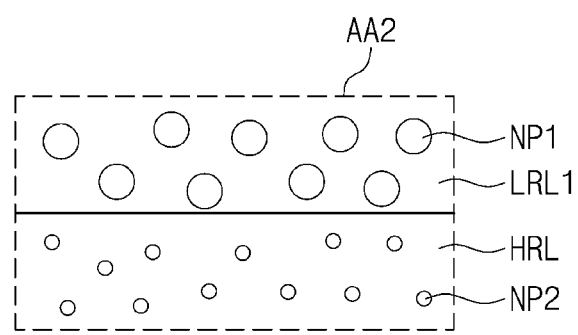
FIG. 4B is an enlarged view of section AA2 in FIG. 4A.
Figure 5A:
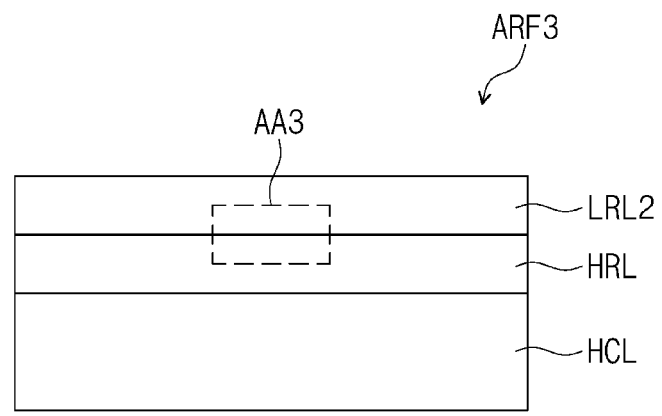
FIG. 5A is a schematic cross-sectional view showing an anti-reflective film according to an embodiment concept.
Figure 5B:
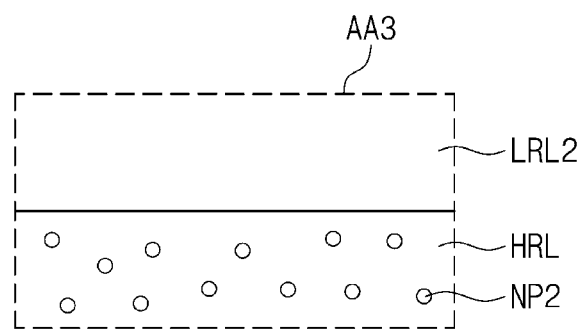
FIG. 5B is an enlarged view of section AA3 in FIG. 5A.
Figure 6:
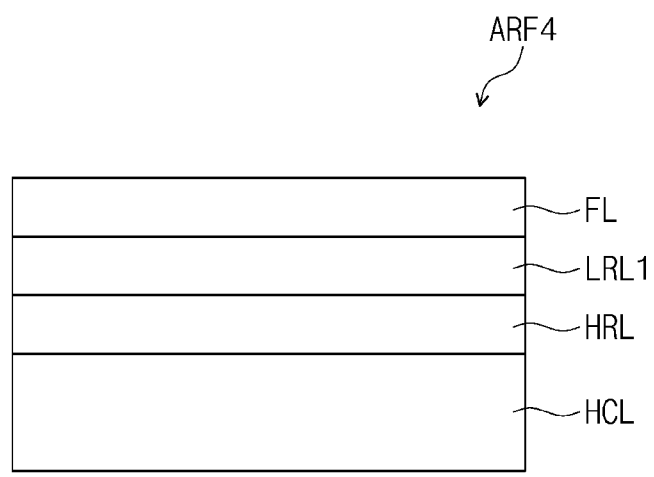
FIG. 6 is a schematic cross-sectional view showing an anti-reflective film according to an embodiment.

FIG. 3A is a schematic cross-sectional view showing an anti-reflective film ARF1 of an embodiment, and FIG. 3B is an enlarged view of section AA1 in FIG. 3A. FIG. 4A is a schematic cross-sectional view showing an anti-reflective film ARF2 of another embodiment, and FIG. 4B is an enlarged view of section AA2 in FIG. 4A. FIG. 5A is a schematic cross-sectional view showing an anti-reflective film ARF3 of another embodiment, and FIG. 5B is an enlarged view of section AA3 in FIG. 5A. FIG. 6 is a schematic cross-sectional view showing an anti-reflective film ARF4 of an embodiment.

In FIG. 3A, FIG. 4A, FIG. 5A, and FIG. 6, schematic cross-sectional views cut in a first direction DR1 of the anti-reflective film ARF in FIG. 2 are shown, but the schematic cross-sectional views cut in a second direction DR2 of the anti-reflective film ARF may have a substantially same shape.

Referring to FIG. 3A, the anti-reflective film ARF1 of an embodiment includes a hard coating layer HCL and a low-refractive layer LRL1 stacked in order. The anti-reflective film ARF1 according to an embodiment may have a pencil hardness measured on the surface of the low-refractive layer LRL1 equal to or greater than 3H. If the pencil hardness is less than 3H, the hardness is low, and a durability which enables the endurance of an external force may not be achieved, and the protection of the display device DD may be difficult. The pencil hardness of the anti-reflective film ARF1 may be equal to or less than 8H. If the pencil hardness is greater than 8H, the hardness is too high, and the anti-reflective film ARF1 may not be sufficiently flexible, so that if an external force is applied, a crack may be easily generated.

The low-refractive layer LRL1 includes a same resin as the curable resin included in the hard coating layer HCL to increase surface hardness and increase interface adhesiveness between the layers. Accordingly, the anti-reflective film ARF1 may not include a separate adhesive layer between the hard coating layer HCL and the low-refractive layer LRL1 and may have excellent abrasion resistance.

Although not shown, the anti-reflective film ARF1 may further include a base film under the hard coating layer HCL. The base film may support the anti-reflective film ARF1, or the base film may function as a protection layer for protecting the anti-reflective film ARF1. The base film may be made from any material having transmittance, without limitation, and for example, a polyethylene terephthalate (PET) film may be used.

In the description, the term "substituted or unsubstituted" corresponds to substituted or unsubstituted with one or more substituents selected from the group consisting of a deuterium atom, a halogen atom, a cyano group, a nitro group, an amine group, a silyl group, a boron group, a phosphine oxide group, a phosphine sulfide group, an alkyl group, an alkenyl group, an aryl group, and a heterocyclic group. Each of the substituents may be substituted or unsubstituted. For example, a biphenyl group may be interpreted as an aryl group or a phenyl group substituted with a phenyl group.

In the description, the halogen atom may be, for example, a fluorine atom, a chlorine atom, a bromine atom, or an iodine atom.

In the description, the alkyl group may be a linear, branched, or cyclic type. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the alkenyl group may be a linear chain or a branched chain. The carbon number is not specifically limited, but is 2 to 30, 2 to 20 or 2 to 10. Examples of the alkenyl group include a vinyl group, a 1-butenyl group, a 1-pentenyl group, a 1,3-butadienyl aryl group, a styrenyl group, a styrylvinyl group, etc., without limitation.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, the heteroaryl group may include one or more among O, N, P, Si and S as heteroatoms. The carbon number for forming a ring of the heteroaryl group may be 2 to 30 or 2 to 20. The heteroaryl group may be a monocyclic heteroaryl group or polycyclic heteroaryl group. The polycyclic heteroaryl group may have, for example, a two-ring or three-ring structure. Examples of the heteroaryl group may include thiophene, furan, pyrrole, imidazole, thiazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phenoxazyl, phthalazinyl, pyrido pyrimidinyl, pyrido pyrazinyl, pyrazino pyrazinyl, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophenyl, thienothiophene, benzofuranyl, phenanthroline, thiazolyl, isooxazolyl, oxadiazolyl, oxadiazole, thiadiazolyl, benzothiazolyl, phenothiazinyl, dibenzosilole, dibenzofuranyl, etc., without limitation.

The hard coating layer HCL may include a curable resin. The curable resin may include silsesquioxane. In an embodiment, the silsesquioxane may include two or more repeating units among a first repeating unit to a fourth repeating unit below.

[First repeating unit]

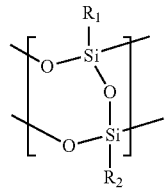

[Second repeating unit]

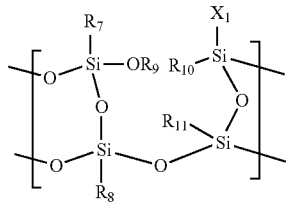

[Third repeating unit]

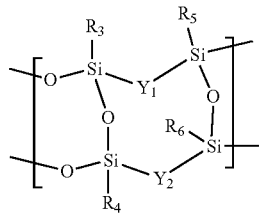

[Fourth repeating unit]

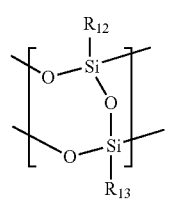

In the third repeating unit, at least one of $Y_1$ and $Y_2$ may be $[(SiO_{3/2}R_{21})_{4+2n}O]$, and the remainder may be O or $NR_{22}$, and in the second repeating unit, $X_1$ may be $[(SiO_{3/2}R_{23})_{4+2m}O]$ or $R_{24}$.

In the first repeating unit to the fourth repeating unit, $R_{21}$ to $R_{24}$ may each independently be a substituted or unsubstituted alkyl group of 1 to 12 carbon atoms, n and m may each independently be an integer from 1 to 20, and $R_1$ to $R_{13}$ may each independently be a hydrogen atom, a deuterium atom, a halogen atom, an isocyanate group, a cyano group, a nitro group, a substituted or unsubstituted amine group, a substituted or unsubstituted epoxy group, a substituted or unsubstituted acryl group, a substituted or unsubstituted oxy group, a substituted or unsubstituted thiol group, a substituted or unsubstituted alkyl group of 1 to 12 carbon atoms, a substituted or unsubstituted heterocycloalkyl group of 3 to 12 carbona toms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms, and $R_1$ and $R_{12}$ may be different from each other.

In an embodiment, the silsesquioxane may be represented by any one among Formula 1 to Formula 4 below.

[Formula 1]

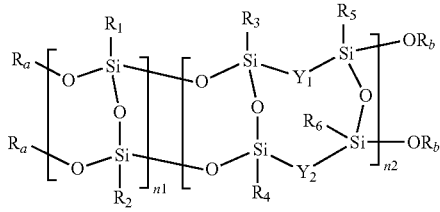

[Formula 2]

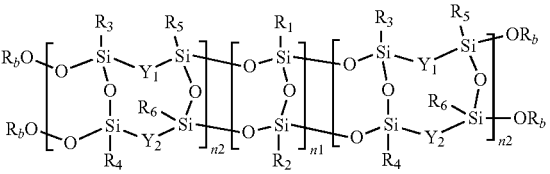

[Formula 3]

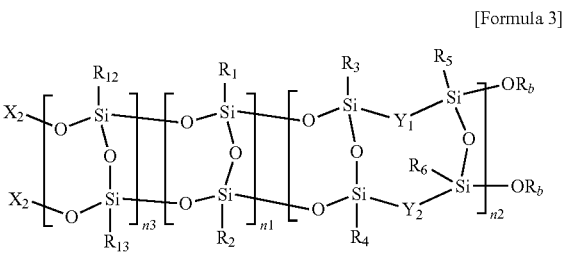

[Formula 4]

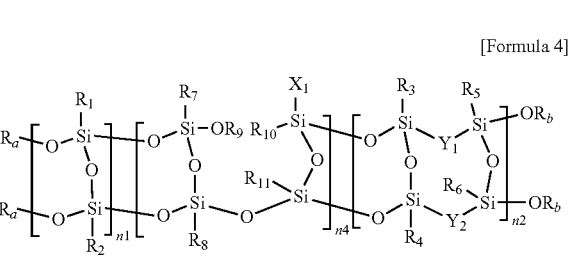

In Formula 1 to Formula 4, $Y_1$ and $Y_2$ may each independently be O, $NR_{20}$, or $[(SiO_{3/2}R_{21})_{4+2n}O]$, and at least one of $Y_1$ and $Y_2$ may be $[(SiO_{3/2}R_{21})_{4+2n}O]$.

In Formula 1 to Formula 4, $X_1$ and $X_2$ may each independently be $R_{22}$ or $[(SiO_{3/2}R_{23})_{4+2n'}O]$, and at least one of $X_1$ and $X_2$ may be $[(SiO_{3/2}R_{23})_{4+2n'}O]$.

In Formula 1 to Formula 4, $R_{20}$ to $R_{23}$ may each independently be a substituted or unsubstituted alkyl group of 1 to 12 carbon atoms, and n and n' may each independently be an integer from 1 to 20.

In Formula 1 to Formula 4, $R_a$ to $R_c$ may each independently be a substituted or unsubstituted alkyl group of 1 to 12 carbon atoms.

In Formula 1 to Formula 4, n1 and n2 may each independently be an integer from 1 to 100,000, n3 may be 1 or 2, and n4 may be an integer from 1 to 500.

In Formula 1 to Formula 4, $R_1$ to $R_{13}$ may each independently be a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbo atoms, and $R_1$ and $R_{12}$ may be different from each other.

In an embodiment, the silsesquioxane may be represented by any one among Formula 5 to Formula 7 below.

[Formula 5]

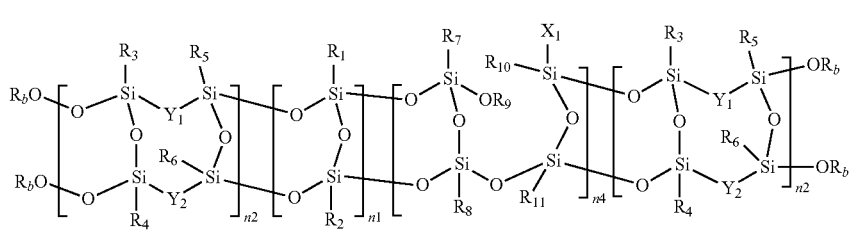

[Formula 6]

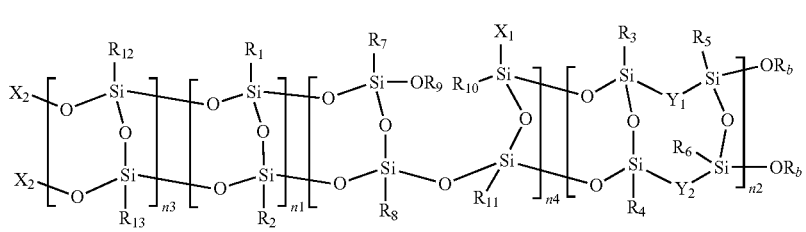

[Formula 7]

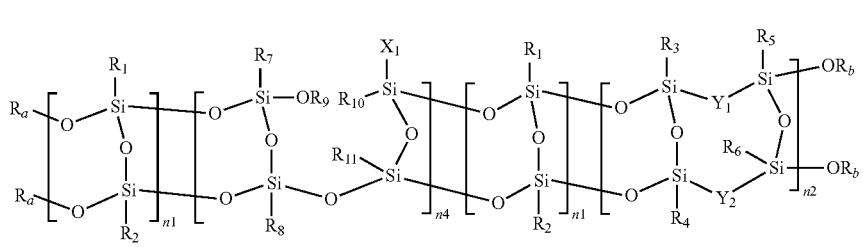

In Formula 5 to Formula 7, $Y_1$ and $Y_2$ may each independently be O, $NR_{20}$, or $[(SiO_{3/2}R_{21})_{4+2n}O]$, and at least one of $Y_1$ and $Y_2$ may be $[(SiO_{3/2}R_{21})_{4+2n}O]$.

In Formula 5 to Formula 7, $X_1$ and $X_2$ may each independently be $R_{22}$ or $[(SiO_{3/2}R_{23})_{4+2n}O]$, and at least one of $X_1$ and $X_2$ may be $[(SiO_{3/2}R_{23})_{4+2n}O]$.

In Formula 5 to Formula 7, $R_{20}$ to $R_{23}$ may each independently be a substituted or unsubstituted alkyl group of 1 to 12 carbon atoms, and n and n' may each independently be an integer from 1 to 20.

In Formula 5 to Formula 7, $R_a$ to $R_c$ may each independently be a substituted or unsubstituted alkyl group of 1 to 12 carbon atoms.

In Formula 5 to Formula 7, n1 and n2 may each independently be an integer from 1 to 100,000, n3 may be 1 or 2, and n4 may be an integer from 1 to 500.

In Formula 5 to Formula 7, $R_1$ to $R_{13}$ may each independently be a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms, and $R_1$ and $R_{12}$ may be different from each other.

In an embodiment, the silsesquioxane may be represented by Formula 8 or Formula 9 below.

[Formula 8]

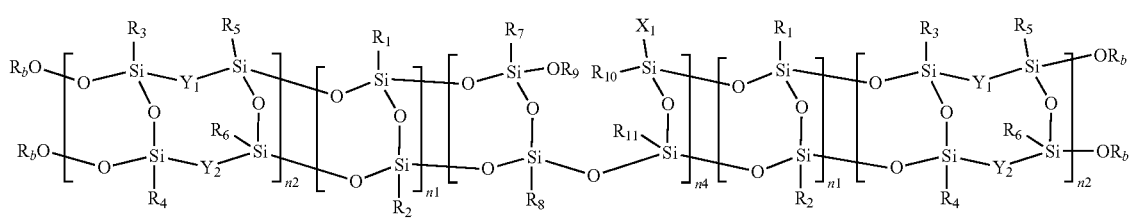

[Formula 9]

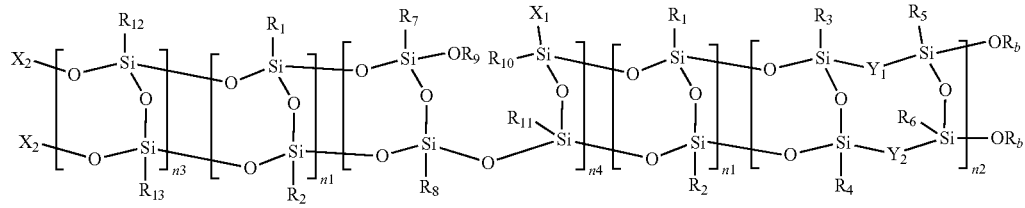

In Formula 8 and Formula 9, $Y_1$ and $Y_2$ may each independently be O, $NR_{20}$, or $[(SiO_{3/2}R_{21})_{4+2n}O]$, and at least one of $Y_1$ and $Y_2$ may be $[(SiO_{3/2}R_{21})_{4+2n}O]$.

In Formula 8 and Formula 9, $X_1$ and $X_2$ may each independently be $R_{22}$ or $[(SiO_{3/2}R_{23})_{4+2n}O]$, and at least one of $X_1$ and $X_2$ may be $[(SiO_{3/2}R_{23})_{4+2n}O]$.

In Formula 8 and Formula 9, $R_{20}$ to $R_{23}$ may each independently be a substituted or unsubstituted alkyl group of 1 to 12 carbon atoms, and n and n' may each independently be an integer from 1 to 20.

In Formula 8 and Formula 9, $R_a$ to $R_c$ may each independently be a substituted or unsubstituted alkyl group of 1 to 12 carbon atoms.

In Formula 8 and Formula 9, n1 and n2 may each independently be an integer from 1 to 100,000, n3 may be 1 or 2, and n4 may be an integer from 1 to 500.

In Formula 8 and Formula 9, $R_1$ to $R_3$ may each independently be a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms, and $R_1$ and $R_{12}$ may be different from each other.

In an embodiment, the curable resin may further include a polymer resin represented by any one among Formula 10 to Formula 14 below.

[Formula 10]

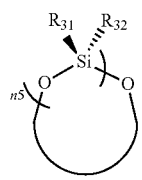

[Formula 11]

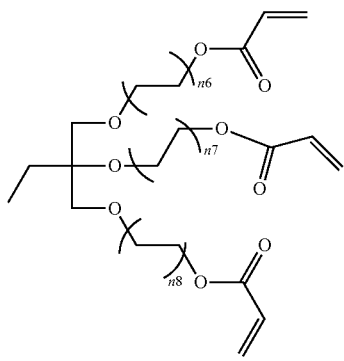

[Formula 12]

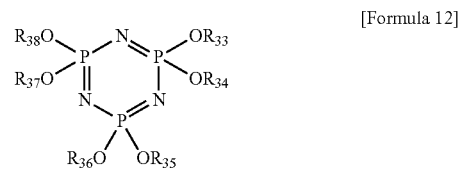

[Formula 13]

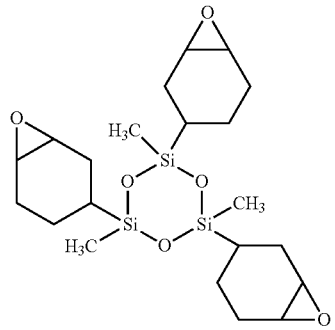

[Formula 14]

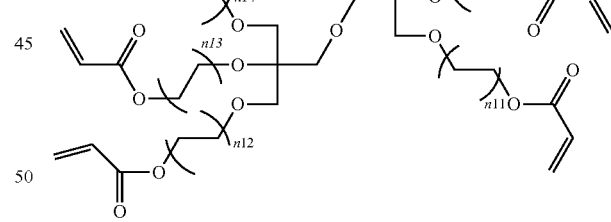

In Formula 10 to Formula 14, n5 may be an integer from 1 to 20, n6 to n8 may each independently be an integer from 1 to 5, n9 to n14 may each independently be an integer from 1 to 12, and $R_{31}$ to $R_{38}$ may each independently be represented by $R_x$ or $R_y$ below.

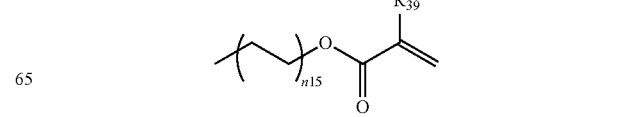

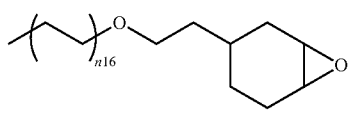

In $R_x$ and $R_y$, n15 and n16 may each independently be an integer from 1 to 12, and $R_{39}$ may be a hydrogen atom or a methyl group.

In an embodiment, a thickness of the hard coating layer HCL may be in a range of about 600 nm to about 1,000 nm. If the above-described range is satisfied, the anti-reflective film may have sufficient durability.

In an embodiment, the hard coating layer HCL may have a greater refractive index than the low-refractive layer LRL1. For example, the hard coating layer HCL may have a refractive index in a range of about 1.45 to about 1.6.

The low-refractive layer LRL1 may include a same material as the hard coating layer HCL and may have increased adhesiveness onto the hard coating layer HCL. The low-refractive layer LRL1 includes a same curable resin as the curable resin included in the hard coating layer HCL and may have excellent hardness. The same contents on the curable resin explained above may be applied to the curable resin.

In an embodiment, the low-refractive layer LRL1 may have a smaller refractive index than the hard coating layer HCL. For example, the low-refractive layer LRL1 may have a refractive index in a range of about 1.25 to about 1.45. For example, the low-refractive layer LRL1 may have a refractive index in a range of about 1.3 to about 1.45. The anti-reflective film ARF1 according to the inventive concept may include at an outside, i.e., in the counter direction to the direction indicated by the third directional axis DR3, a two-layered structure of a layer having a relatively low refractive index and a layer having a relatively high refractive index. Accordingly, improved anti-reflective effects may be achieved.

In an embodiment, a thickness of the low-refractive layer LRL1 may be in a range of about 70 nm to about 200 nm. For example, the thickness of the low-refractive layer LRL1 may be in a range of about 100 nm to about 200 nm. If the thickness of the low-refractive layer LRL1 satisfies the above-described range, the anti-reflective film AFR1 may have excellent anti-reflective effects.

Referring to FIG. 3B, the low-refractive layer LRL1 may include first nanoparticles NP1 having a relatively small refractive index. In FIG. 3B, the first nanoparticle NP1 is shown in a spherical shape, but an embodiment of the inventive concept is not limited thereto. The first nanoparticle NP1 may have various shapes such as a hexahedron and an ellipse, without limitation.

In an embodiment, a size of the first nanoparticle NP1 may be in a range of about 40 nm to about 100 nm. In the inventive concept, the size of the particle may mean the farthest distance between optional end points in a particle, for example, a diameter. If the range is satisfied, the type is not specifically limited, and for example, the first nanoparticle NP1 may be at least one of a hollow silica, a hollow acrylate polymer, a hollow vinyl polymer, and a hollow epoxy polymer. For example, the first nanoparticle NP1 may be a hollow silica. If the first nanoparticle NP1 is the hollow silica, dispersion in a curable resin including silsesquioxane may be more effectively performed, and anti-reflective effects may be excellent. The hard coating layer HCL may not include a separate particle.

In an embodiment, an amount of the first nanoparticle NP1 may be included in a range of about 10% to about 60% by weight with respect to the curable resin included in the low-refractive layer LRL1.

Referring to FIG. 4A and FIG. 5A, the anti-reflective films ARF2 and ARF3 of embodiments include a hard coating layer HCL, a high-refractive layer HRL and, respectively, low-refractive layers LRL1 and LRL2 disposed in order. Hereinafter, the same elements as the elements explained referring to FIG. 3A and FIG. 3B will use the same symbols of drawings, and a detailed description thereof will be omitted. Although not shown, the anti-reflective films ARF2 and ARF3 may further include a base layer under the hard coating layer HCL.

In an embodiment, the anti-reflective films ARF2 and ARF3 may further include a high-refractive layer HRL disposed between the hard coating layer HCL and the low-refractive layers LRL1 and LRL2. The high-refractive layer HRL may have a higher refractive index than the hard coating layer HCL and a higher refractive index than the low-refractive layer LRL1. For example, the high-refractive layer HRL may have a refractive index in a range of about 1.6 to about 1.75.

The high-refractive layer HRL may include a same material as the hard coating layer HCL and may have improved adhesiveness to the hard coating layer HCL. The high-refractive layer HRL may include a same curable resin as the curable resin included in the hard coating layer HCL and may have excellent hardness. The same explanation on the above-described curable resin may be applied to the curable resin.

In an embodiment, a thickness of the high-refractive layer HRL may be in a range of about 70 nm to about 200 nm. For example, the thickness of the high-refractive layer HRL may be in a range of about 100 nm to about 200 nm. If the thickness of the high-refractive layer HRL satisfies the above-described range, the anti-reflective film AFR2 may have excellent anti-reflective effects.

Referring to FIG. 4B, the high-refractive layer HRL may include a second nanoparticle NP2 which is distinguished from the first nanoparticle NP1. In FIG. 4B, the second nanoparticle NP2 is shown to have a spherical shape, but is not limited thereto. The second nanoparticle NP2 may have various shapes such as a hexahedron and an ellipse, without specific limitation.

The second nanoparticle NP2 may have a smaller size than the first nanoparticle NP1. For example, a size of the second nanoparticle NP2 may be in a range of about 10 nm to about 30 nm. If the above-described range is satisfied, the type is not specifically limited. For example, the second nanoparticle NP2 may include at least one of $C_{60}$ (fullerene), $TiO_2$, ZnO, SiC, GaP, Ag, $ZrO_2$, and Au.

In an embodiment, an amount of the second nanoparticle NP2 may be included in a range of about 10% to about 60% by weight based on the curable resin included in the high-refractive layer HRL.

Referring to FIG. 5A, the anti-reflective film ARF3 may include a second low-refractive layer LRL2 of an embodiment, which is disposed on the high-refractive layer HRL. The second low-refractive layer LRL2 according to an embodiment may have a smaller refractive index than the high-refractive layer HRL and may have a same refractive index as the hard coating layer HCL. For example, the second low-refractive layer LRL2 and the hard coating layer HCL may be formed using a same material.

Referring to FIG. 5B, the second low-refractive layer LRL2 of an embodiment, disposed on the high-refractive layer HRL may include the curable resin according to an embodiment but may not include the first nanoparticle. Accordingly, the second low-refractive layer LRL2 not including the first nanoparticle may have a same refractive index as the hard coating layer HCL.

Since the anti-reflective film ARF3 includes the high-refractive layer HRL having a higher refractive index than the hard coating layer HCL, although the second low-refractive layer LRL2 has a same refractive index as the hard coating layer HCL, from an outside, a two-layered structure of a layer having a relatively low refractive index and a layer having a relatively high refractive index may be included, and improved anti-reflective effects may be achieved.

Referring to FIG. 6, the anti-reflective film ARF4 of an embodiment may further include a functional layer FL disposed on the low-refractive layer LRL1. The functional layer FL may be disposed at an outside of the anti-reflective film ARF4. In FIG. 6, the structure of the anti-reflective film ARF4 excluding the functional layer FL is shown as an embodiment and may have the structures of FIG. 4A and FIG. 5A.

The functional layer FL may be composed of a single layer or multiple layers. The functional layer FL may include at least one among a hard coating layer, an anti-fingerprint layer, and a shatter-resistant layer. In an embodiment, the functional layer FL may include a fluorine-containing compound. In an embodiment, the functional layer FL including the fluorine-containing compound may be an anti-fingerprint layer.

Figure 9A:
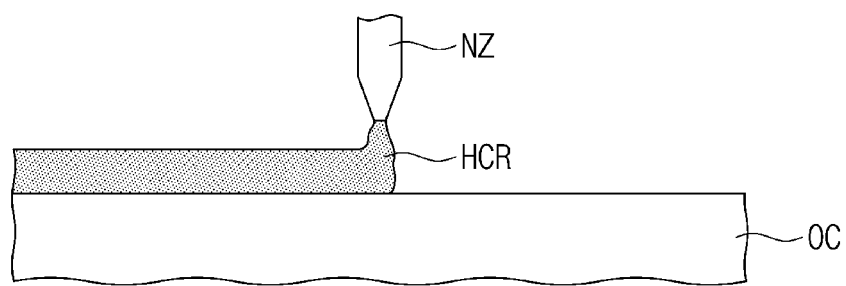
FIG. 9A and FIG. 9B are diagrams partially showing the steps of manufacturing an anti-reflective film according to an embodiment.

Table 1 below shows the measurement results of the physical properties of anti-reflective films according to an Example and a Comparative Example. The anti-reflective film of the Example was manufactured by the application on a display panel as shown in FIG. 9A. The anti-reflective film of the Example includes a hard coating layer including a curable resin including polysilsesquioxane represented by Formula 1, $TiO_2$, $ZrO_2$, a high-refractive layer including a same curable resin, and a low-refractive layer including hollow silica and a same curable resin, stacked in order as in FIG. 4A. In the high-refractive layer, $TiO_2$, and $ZrO_2$ are included such that the total amount is in a range of about 10% to about 60% by weight, and the hollow silica in the low-refractive layer is included in an amount in a range of about 10% to about 60% by weight. The anti-reflective film of the Comparative Example was manufactured into a film shape and attached onto the display panel. In the anti-reflective film of the Comparative Example, the high-refractive layer and the low-refractive layer do not include a same curable resin as the hard coating layer but include an acryl resin. The anti-reflective film has the same configuration as the Example except that the total amount of $TiO_2$ and $ZrO_2$ in the high-refractive layer is less than about 10% by weight, and the amount of the hollow silica in the low-refractive layer is less than about 10% by weight.

1. Measurement of Reflectivity and Transmittance

The reflectivity and transmittance on light with a wavelength of about 400 nm to about 750 nm were measured using CM-3600D. The reflectivity was measured at an angle of about 5 degrees.

2. Measurement of Surface Hardness

The pencil hardness was measured with a load of about 1 kg, at a contact angle of a pencil of about 45 degrees with a moving rate of the pencil of about 1 mm/sec.

3. Measurement of Scratch Resistance

A load was applied to a steel wool (#0000), and the surface of the anti-reflective films obtained in the Example and Comparative Example were rubbed therewith while going back and forth 10 times at a rate of about 27 rpm. The maximum load observing one or less scratches with about 1 cm or less with the naked eye was measured.

TABLE 1

|  | Comparative Example | Example |
| --- | --- | --- |
| Reflectivity (%) | 0.3 | 0.3 |
| Transmittance (%) | 95.9 | 96.0 |
| Pencil hardness | B | 4H |
| Scratch resistance (g) | 150 | 1000 |
| Tolerance | 500 μm or more | 30 μm or less |

Referring to Table 1, it could be confirmed that the anti-reflective film according to the Example showed excellent reflectivity and transmittance, and achieved higher pencil hardness and scratch resistance than the Comparative Example at the same time.

Figure 7:
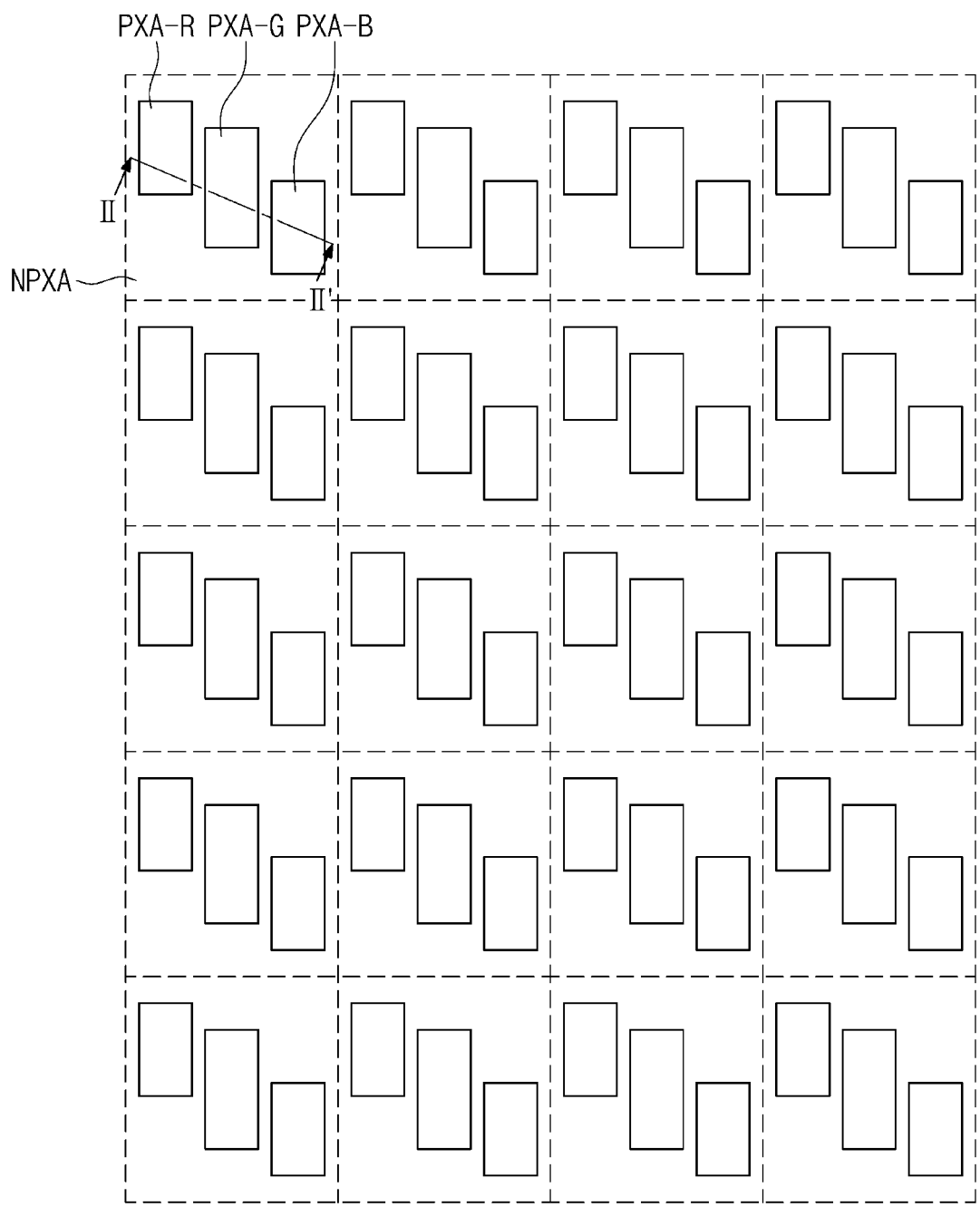
FIG. 7 is an enlarged plan view on a part of a display device according to an embodiment.

FIG. 7 is an enlarged plan view showing a part of the display device according to the Example. FIG. 8 is a schematic cross-sectional view of a display device DD1 according to an embodiment. In FIG. 7, the display area DA according to an embodiment of the inventive concept is partially shown. FIG. 8 shows a part corresponding to line II-II' in FIG. 7.

Referring to FIG. 7 and FIG. 8, a display device DD may include a non-luminous area NPXA and luminous areas PXA-B, PXA-G, and PXA-R. The luminous areas PXA-B, PXA-G, and PXA-R may be areas emitting light produced from the light emitting devices ED, respectively. The luminous areas PXA-B, PXA-G, and PXA-R may be separated from each other on a plane. The areas of the luminous areas PXA-B, PXA-G, and PXA-R are shown as the same, but may be different from each other, without limitation. For example, the area may mean an area in view of a plane.

The luminous areas PXA-B, PXA-G, and PXA-R may be divided in multiple groups according to the color of light emitted. In the display device DD1 of an embodiment, shown in FIG. 7 and FIG. 8, three luminous areas PXA-B, PXA-G, and PXA-R emitting blue light, green light, and red light, respectively, are shown as an embodiment. For example, the display device DD1 of an embodiment may include a red light emitting area PXA-R, a blue light emitting area PXA-B, and a green light emitting area PXA-G, distinguished from one another.

In an embodiment, the luminous areas PXA-B, PXA-G, and PXA-R may have a stripe structure in which a blue light emitting area PXA-B, a green light emitting area PXA-G, and a red light emitting area PXA-R are alternately arranged. The area of the green light emitting area PX-G may be greater than the area of the blue light emitting area PXA-B and the area of the red light emitting area PXA-R. The areas of the blue light emitting area PXA-B and the red light emitting area PXA-R may be the same. For example, the area may mean an area on a plane. However, an embodiment of the inventive concept is not limited thereto, and the areas of the luminous areas PXA-B, PXA-G, and PXA-R may be the same or different, and the luminous areas PXA-B, PXA-G, and PXA-R may have various polygonal shapes or a circular shape. The arrangement structure of the luminous areas is not limited to the stripe structure, and may be, for example, a PenTile® structure.

Referring to FIG. 8, the display device DD1 of an embodiment may include a light converting layer CCL disposed on the display panel DP. The display device DD1 according to an embodiment may further include a color filter layer CFL. The color filer layer CFL may be disposed between a cover layer OC and the light converting layer CCL.

The display panel DP may be a light-emitting type display panel. For example, the display panel DP may be an organic electroluminescence display panel, or a quantum dot light-emitting display panel.

The display panel DP may include abase substrate BS, a circuit layer DP-CL provided on the base substrate BS and a display device layer DP-ED. The display device layer DP-ED may include a pixel definition layer PDL, a light emitting device ED disposed in the pixel definition layer PDL, and an encapsulating layer TFE disposed on the light emitting device ED.

The pixel definition layer PDL may be formed using a polymer resin. For example, the pixel definition layer PDL may be formed by including a polyacrylate-based resin or a polyimide-based resin. The pixel definition layer PDL may be formed by including a light-absorbing material or including a black pigment or a black dye. The pixel definition layer PDL may be formed using an inorganic material. For example, the pixel definition layer PDL may be formed by including silicon nitride (SiNx), silicon oxide (SiOx), silicon oxynitride (SiOxNy), etc. The pixel definition layer PDL may define the luminous areas PXA-B, PXA-G, and PXA-R. The luminous areas PXA-B, PXA-G, and PXA-R and a non-luminous area NPXA may be divided by the pixel definition layer PDL.

The display device layer DP-ED includes a light emitting device ED, and the light emitting device ED may include oppositely disposed first electrode EL1 and second electrode EL2, and multiple layers OL disposed between the first electrode EL1 and the second electrode EL2. The multiple layers OL may include a hole transport region, an emission layer, and an electron transport region. The hole transport region may include a hole injection layer adjacent to the first electrode EL1, and a hole transport layer disposed between the hole injection layer and the emission layer, and the electron transport region may include an electron injection layer adjacent to the second electrode EL2 and an electron transport layer disposed between the emission layer and the electron injection layer. In an embodiment, the light emitting device ED may provide first light. For example, the light emitting device may emit blue light.

In another embodiment, the light emitting device ED may include multiple light emitting structures disposed in order between the first electrode EL1 and the second electrode EL2. Each of the multiple light emitting structures may include an emission layer, and a hole transport region and an electron transport region with the emission layer therebetween. For example, three light emitting structures including an emission layer emitting blue light and one light emitting structure including an emission layer emitting green light may be included. However, an embodiment of the inventive concept is not limited thereto. The disposition order among the light emitting structures or the number of the light emitting structure may be changed diversely.

On the light emitting device ED, an encapsulating layer TFE may be disposed, and the encapsulating layer TFE may be disposed on the second electrode EL2. The encapsulating layer TFE may be disposed directly on the second electrode EL2. The encapsulating layer TFE may be one layer or a stack of multiple layers.

The light converting layer CCL may be disposed on the display panel DP with a capping layer CPL therebetween.

The light converting layer CCL may include multiple partition parts BK separately disposed, and light controlling parts CCP-B, CCP-G, and CCP-R disposed between the partition parts BK. The partition part BK may be formed by including a polymer resin and a repellent solution additive. The partition part BK may be formed by including a light-absorbing material or by including a pigment or a dye. For example, the partition part BK may be formed by including a black pigment or a black dye to achieve a black partition part. As the black pigment or black dye for forming the black partition part, materials such as carbon black, etc., may be used, but an embodiment of the inventive concept is not limited thereto.

The light converting layer CCL may include a first light controlling part CCP-B transmitting first light, a second light controlling part CCP-G including a first quantum dot QD1 converting the first light into second light, and a third light controlling part CCP-R including a second quantum dot QD2 converting the first light into third light. The second light may be light in a longer wavelength region than the first light, and the third light may be light in a longer wavelength region than the first light and the second light. For example, the first light may be blue light, the second light may be green light, and the third light may be red light.

Although not shown, the light converting layer CCL may further include a scatterer. For example, the first light controlling part CCP-B may not include a quantum dot but include the scatterer, the second light controlling part CCP-G may include the first quantum dot QD1 and the scatterer, and the third light controlling part CCP-R may include the second quantum dot QD2 and the scatterer.

The scatterer may be an inorganic particle. For example, the scatterer may include at least one among $TiO_2$, ZnO, $Al_2O_3$, $SiO_2$, and hollow silica. The scatterer may include at least one among $TiO_2$, ZnO, $Al_2O_3$, $SiO_2$, and hollow silica, or may be a mixture of two or more materials selected among $TiO_2$, ZnO, $Al_2O_3$, $SiO_2$, and hollow silica.

The core of the quantum dots QD1 and QD2 of an embodiment may be selected from a II-VI group compound, a III-VI group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-V group compound may include a binary compound such as $In_2S_3$, and $In_2Se_3$, a ternary compound such as $InGaS_3$, and $InGaSe_3$, or optional combinations thereof.

The I-III-VI group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound such as $AgInGaS_2$, and $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The III-V group compound may further include a II group metal. For example, InZnP, InGaZnP, InAlZnP, etc. may be selected as the III-V group compound further including a II group metal.

The IV-VI group compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

The binary compound, the ternary compound, or the quaternary compound may be present at uniform concentration in a particle or may be present at a partially different concentration distribution state in the same particle. A core/shell structure in which one quantum dot wraps another quantum dot may be included. In the core/shell structure, the shell may have a concentration gradient in which the concentration of an element present in the shell is decreased toward the center.

In some embodiments, the quantum dots QD1 and QD2 may have the above-described core-shell structure including a core including a nanocrystal and a shell wrapping the core. The shell of the quantum dots Q1 and Q2 may function as a protection layer for preventing the chemical deformation of the core to maintain semiconductor properties and/or as a charging layer for imparting the quantum dots QD and QD2 with electrophoretic properties. The shell may have a single layer or multiple layers. Examples of the shell of the quantum dot may include a metal or non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO, or a ternary compound such as $MgAl_2O_4$, $CoFe_2O_4$, $NiFe_2O_4$ and $CoMn_2O_4$, but an embodiment of the inventive concept is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but an embodiment of the inventive concept is not limited thereto.

The quantum dots QD1 and QD2 may have a full width of half maximum (FWHM) of emission wavelength spectrum equal to or less than about 45 nm. For example, quantum dots QD1 and QD2 may have a FWHM of emission wavelength spectrum equal to or less than about 40 nm. For example, quantum dots QD1 and QD2 may have a FWHM of emission wavelength spectrum equal to or less than about 30 nm. Within these ranges, color purity or color reproducibility may be improved. Light emitted via such quantum dots QD1 and QD2 may be emitted in all directions, and light viewing angle properties may be improved.

The shape of the quantum dots QD1 and QD2 may be generally used shapes in the art, without specific limitation. For example, the quantum dots QD1 and QD2 may be a spherical, a pyramidal, a multi-arm, or a cubic nanoparticle, nanotube, nanowire, nanofiber, nanoplate particle, etc.

The quantum dots QD1 and QD2 may control the color of light emitted according to the particle size, and accordingly, the quantum dot may have various emission colors such as blue, red, and green.

The light converting layer CCL may further include a capping layer CPL. The capping layer CPL may be disposed on the light controlling parts CCP-B, CCP-G, and CCP-R and the partition part BK. The capping layer CPL may prevent the penetration of moisture and/or oxygen (hereinafter, will be referred to as "moisture/oxygen"). The capping layer CPL may be disposed on the light controlling parts CCP-B, CCP-G, and CCP-R and prevent the exposure of the light controlling parts CCP-B, CCP-G, and CCP-R to moisture/oxygen. The capping layer CPL may include at least one inorganic layer.

In the display device DD1 of an embodiment, the optical layer PP may include a cover layer OC and a color filter layer CFL.

The color filter layer CFL may include a light blocking part BM and a color filter part CF. The color filter part CF may include multiple filters CF-B, CF-G, and CF-R. For example, the color filter layer may include a first filter CF-B transmitting first light, a second filter CF-G transmitting second light, and a third filter CF-R transmitting third light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment or dye. The first filter CF-B may include a blue pigment or dye, the second filter CF-G may include a green pigment or dye, and the third filter CF-R may include a red pigment or dye.

An embodiment of the inventive concept is not limited thereto, but the first filter CF-B may not include a pigment or dye. The first filter CF-B may include a polymer photosensitive resin but not include a pigment or dye. The first filter CF-B may be transparent. The first filter CF-B may be formed using a transparent photosensitive resin.

The light blocking part BM may be a black matrix. The light blocking part BM may be formed by including an organic light blocking material or an inorganic light blocking material including a black pigment or black dye. The light blocking part BM may prevent light leakage and may define the boundaries among adjacent filters CF-B, CF-G, and CF-R.

The color filter layer CFL may further include a buffer layer BFL. For example, the buffer layer BFL may be a protection layer protecting the filters CF-B, CF-G, and CF-R. The buffer layer BFL may be an inorganic layer including at least one inorganic material among silicon nitride, silicon oxide and silicon oxynitride. The buffer layer BFL may be composed of a single layer or multiple layers.

In an embodiment shown in FIG. 8, the first filter CF-B of the color filter layer CFL is shown to overlap with the second filter CF-G and the third filter CF-R, but an embodiment of the inventive concept is not limited thereto. For example, the first to third filters CF-B, CF-G, and CF-R may be divided by the light blocking part BM and may not be overlapped with each other. In an embodiment, each of the first to third filters CF-B, CF-G, and CF-R may be respectively disposed in a blue light emitting area PXA-B, a green light emitting area PXA-G, and a red light emitting area PXA-R, respectively.

Different from FIG. 8, the display device DD1 of an embodiment may include a polarization layer (not shown) instead of the color filter layer CFL as the optical layer PP. The polarization layer (not shown) may block external light provided from an exterior to the display panel DP. The polarization layer (not shown) may partially block the external light.

The polarization layer (not shown) may reduce reflective light generated at the display panel DP by external light. For example, the polarization layer (not shown) may play the role of blocking reflected light of light provided from the exterior of the display device DD, incident to the display panel DP and then, exit. The polarization layer (not shown) may be a circular polarizer having anti-reflective function, or the polarization layer (not shown) may include a linear polarizer and λ/4 phase retarder. The polarization layer (not shown) may be disposed on the cover layer OC and exposed, or the polarization layer (not shown) may be disposed under the cover layer OC.

On the color filter layer CFL, the cover layer OC may be disposed. The cover layer OC may include an organic layer. The cover layer OC may provide a planar top surface. The cover layer OC may further include an inorganic layer such as a hard coating layer disposed on the planar top surface.

Figure 9B:
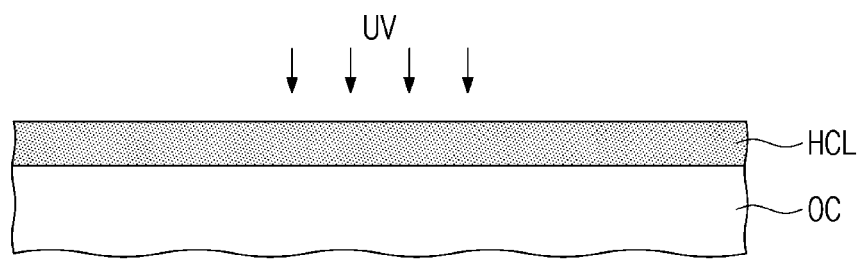

FIG. 9A and FIG. 9B are diagrams schematically showing the steps of forming a hard coating layer HCL among the steps of manufacturing an anti-reflective film ARF according to an embodiment.

FIG. 9A shows a step of supplying a hard coating composition HCR on a cover layer OC. The hard coating composition HCR includes a curable resin composition and may be supplied on the cover layer OC by an ink jet printing method or a dispensing method. FIG. 9B shows a step of forming a hard coating layer HCL by curing the layer formed from the hard coating composition HCR through irradiating ultraviolet rays UV. However, the curing method is not limited thereto, and the hard coating layer HCL may be formed by supplying heat.

The hard coating layer HCL according to an embodiment may be formed by supplying the hard coating composition HCR directly on the cover layer OC through a nozzle NZ, etc. Other layers constituting the anti-reflective film ARF may be formed by a same method. Accordingly, a coating tolerance of the anti-reflective film ARF may be controlled to be equal to or less than about 30 μm and may also be applied to the tiling display device DD (FIG. 1.). The anti-reflective film of an attachment type to the display panel may have a coating tolerance of greater than about 30 μm and may not be applied to a tiling display in which multiple display modules come into contact with each other.

The anti-reflective film of an embodiment may have a stacked structure of two or more layers, and each layer may include a same curable resin having high hardness and has high surface hardness and excellent anti-reflective effects.

The display device of an embodiment includes an anti-reflective film having excellent surface hardness on the exterior and has high reliability and visibility.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An anti-reflective film, comprising:
a hard coating layer comprising a curable resin; and
a low-refractive layer disposed on the hard coating layer and comprising the curable resin, wherein
a pencil hardness measured on the low-refractive layer is equal to or greater than 3H, and
the curable resin comprises polysilsesquioxane represented by at least one of Formulas 4 to 9:

[Formula 4]

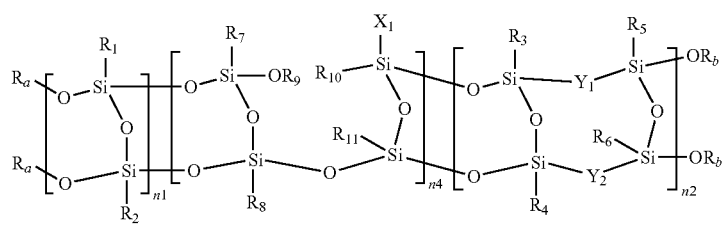

[Formula 5]

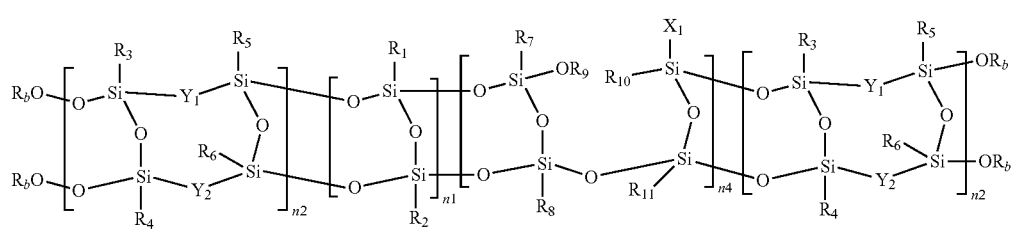

[Formula 6]

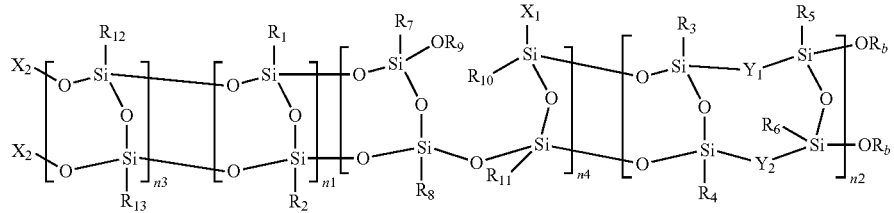

[Formula 7]

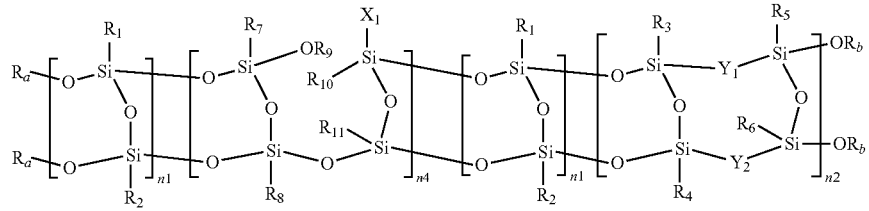

[Formula 8]

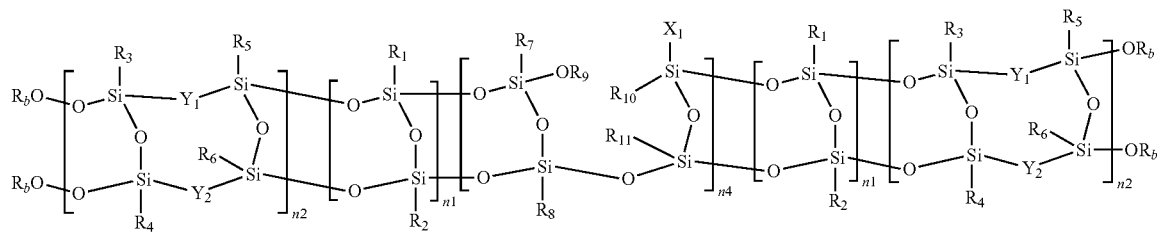

[Formula 9]

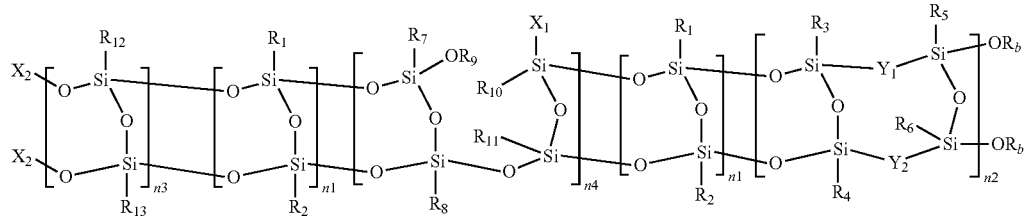

wherein in Formulas 4 to 9, $Y_1$ and $Y_2$ are each independently O, $NR_{20}$, or $[(SiO_{3/2}R_{21})_{4+2n}O]$, at least one of $Y_1$ and $Y_2$ is $[(SiO_{3/2}R_{21})_{4+2n}O]$, $X_1$ and $X_2$ are each independently $R_{22}$ or $[(SiO_{3/2}R_{23})_{4+2n}O]$, at least one of $X_1$ and $X_2$ is $[(SiO_{3/2}R_{23})_{4+2n}O]$, $R_{20}$ to $R_{23}$ are each independently a substituted or unsubstituted alkyl group of 1 to 12 carbon atoms, n and n' are each independently an integer from 1 to 20, $R_a$ to $R_c$ are each independently a substituted or unsubstituted alkyl group of 1 to 12 carbon atoms, n1 and n2 are each independently an integer from 1 to 100,000, n3 is 1 or 2, n4 is an integer from 1 to 500, $R_1$ to $R_7$, $R_9$, $R_{10}$, $R_{12}$, and $R_{13}$ are each independently a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms, $R_8$ and $R_{11}$ are each independently a deuterium atom, a halogen atom, an isocyanate group, a nitro group, or a substituted or unsubstituted heteroaryl group of 2 to 12 carbon atoms, and $R_1$ and $R_{12}$ are different from each other.

2. The anti-reflective film of claim 1, wherein the low-refractive layer comprises a first nanoparticle having a size in a range of about 40 nm to about 100 nm.

3. The anti-reflective film of claim 2, wherein
the hard coating layer has a refractive index in a range of about 1.45 to about 1.6,
the low-refractive layer has a refractive index in a range of about 1.25 to about 1.45, and
the refractive index of the hard coating layer is greater than the refractive index of the low-refractive layer.

4. The anti-reflective film of claim 2, wherein the first nanoparticle comprises at least one of a hollow silica, a hollow acrylate polymer, a hollow vinyl polymer, and a hollow epoxy polymer.

5. The anti-reflective film of claim 1, further comprising a high-refractive layer disposed between the hard coating layer and the low-refractive layer, wherein
the high-refractive layer comprises the curable resin and a second nanoparticle having a size in a range of about 10 nm to about 30 nm.

6. The anti-reflective film of claim 5, wherein
the high-refractive layer has a refractive index in a range of about 1.6 to about 1.75, and
the refractive index of the high-refractive layer is greater than the refractive index of the hard coating layer and greater than the refractive index of the low-refractive layer.

7. The anti-reflective film of claim 5, wherein the second nanoparticle comprises at least one of $C_{60}$ (fullerene), $TiO_2$, ZnO, SiC, GaP, Ag, $ZrO_2$, and Au.

8. The anti-reflective film of claim 6, wherein the low-refractive layer and the hard coating layer have a same refractive index.

9. The anti-reflective film of claim 1, further comprising a functional layer disposed on the low-refractive layer, the functional layer comprising a fluorine-containing compound.

10. A display device, comprising:
a display panel; and
an anti-reflective film disposed on the display panel, wherein
the anti-reflective film comprises:
a hard coating layer comprising a curable resin; and
a low-refractive layer disposed on the hard coating layer and comprising the curable resin,
a pencil hardness measured on the low-refractive layer is equal to or greater than 3H, and
the curable resin comprises polysilsesquioxane represented by at least one of Formulas 4 to 9:

[Formula 4]

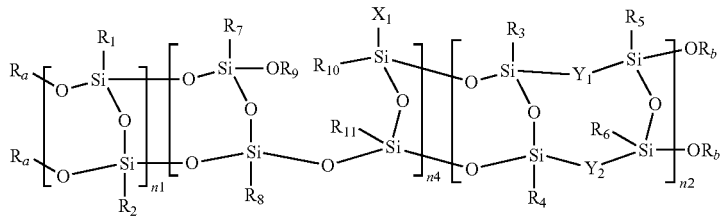

[Formula 5]

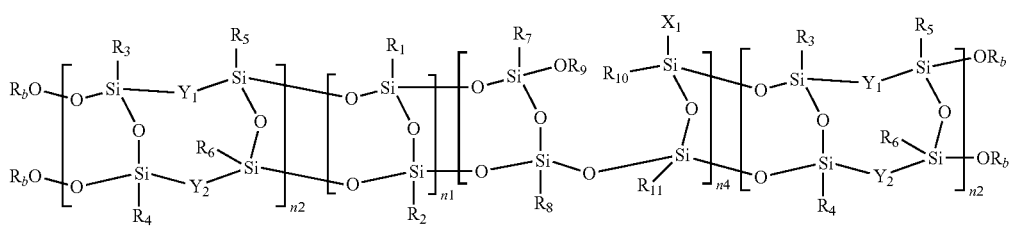

[Formula 6]

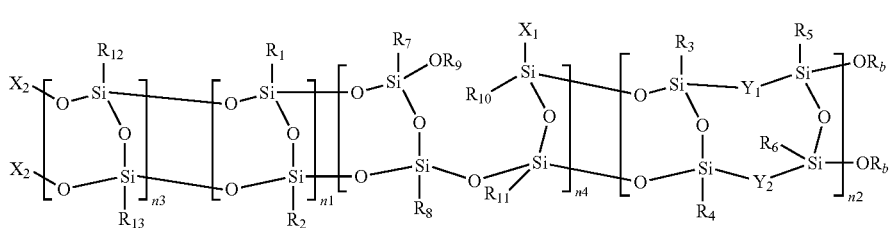

[Formula 7]

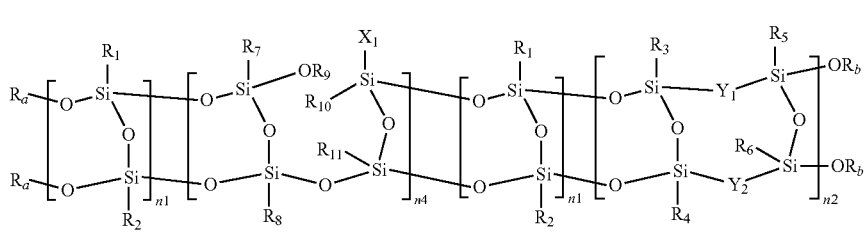

[Formula 8]

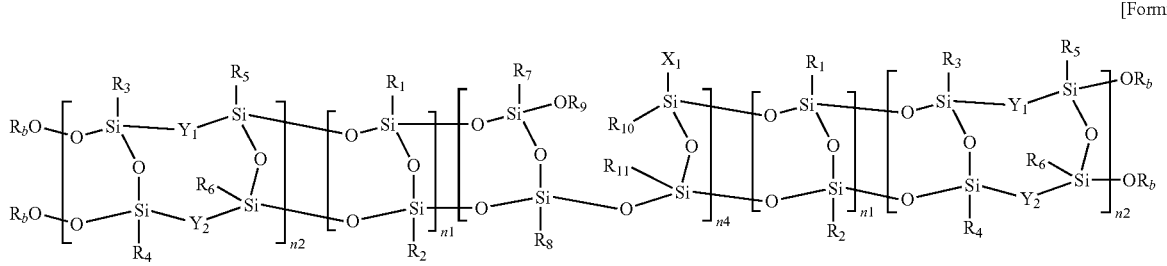

[Formula 9]

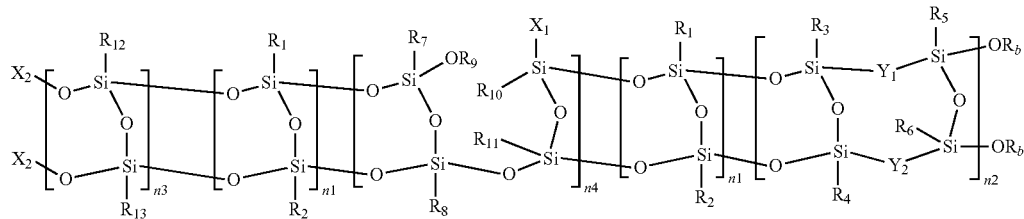

wherein in Formulas 4 to 9,
$Y_1$ and $Y_2$ are each independently O, $NR_{20}$, or $[(SiO_{3/2}R_{21})_{4+2n}O]$,
at least one of $Y_1$ and $Y_2$ is $[(SiO_{3/2}R_{21})_{4+2n}O]$,
$X_1$ and $X_2$ are each independently $R_{22}$ or $[(SiO_{3/2}R_{23})_{4+2n}O]$,
at least one of $X_1$ and $X_2$ is $[(SiO_{3/2}R_{23})_{4+2n}O]$,
$R_{20}$ to $R_{23}$ are each independently a substituted or unsubstituted alkyl group of 1 to 12 carbon atoms,
n and n' are each independently an integer from 1 to 20,
$R_a$ to $R_c$ are each independently a substituted or unsubstituted alkyl group of 1 to 12 carbon atoms,
n1 and n2 are each independently an integer from 1 to 100,000,
n3 is 1 or 2,
n4 is an integer from 1 to 500,
$R_1$ to $R_7$, $R_9$, $R_{10}$, $R_{12}$, and $R_{13}$ are each independently a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms,
$R_8$ and $R_{11}$ are each independently a deuterium atom, a halogen atom, an isocyanate group, a nitro group, a substituted or unsubstituted aryl group of 6 to 12 carbon atoms, or a substituted or unsubstituted heteroaryl group of 2 to 12 carbon atoms, and
$R_1$ and $R_{12}$ are different from each other.

11. The display device of claim 10, wherein the low-refractive layer comprises a first nanoparticle having a size in a range of about 40 nm to about 100 nm.

12. The display device of claim 10, wherein the anti-reflective film further comprises a high-refractive layer disposed between the hard coating layer and the low-refractive layer, and the high-refractive layer comprises the curable resin and a second nanoparticle having a size in a range of about 10 nm to 30 about nm.

13. The display device of claim 10, further comprising a light converting layer disposed between the display panel and the anti-reflective film, the light converting layer comprising at least one light controlling part comprising a quantum dot.

14. The display device of claim 13, wherein
the display panel comprises a light emitting device generating first light, and
the light converting layer comprises:
a first light controlling part transmitting the first light;
a second light controlling part converting the first light into second light; and
a third light controlling part converting the first light into third light.

15. The display device of claim 14, further comprising a color filter layer disposed on the light converting layer, wherein
the color filter layer comprises:
a first filter transmitting the first light;
a second filter transmitting the second light; and
a third filter transmitting the third light.

16. The display device of claim 15, further comprising an organic layer disposed on the color filter layer and providing a planar top surface.

17. The display device of claim 16, wherein the anti-reflective film is directly applied and formed on the organic layer.

18. A tiling display device comprising:
display modules disposed along a first direction and a second direction intersecting the first direction, wherein each of the display modules comprises a display panel and an anti-reflective film disposed on the display panel,
the anti-reflective film comprises:
a hard coating layer comprising a curable resin; and
a low-refractive layer disposed on the hard coating layer and comprising the curable resin,
a pencil hardness measured on the low-refractive layer is equal to or greater than 3H, and
the curable resin comprises polysilsesquioxane represented by at least one of Formulas 4 to 9:

[Formula 4]

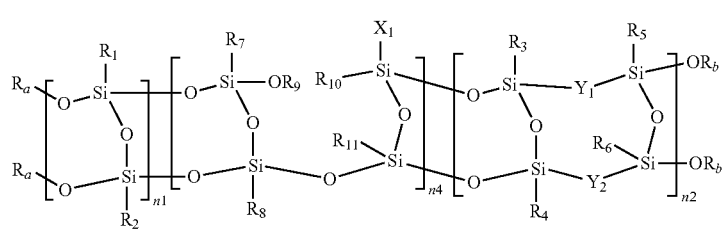

[Formula 5]

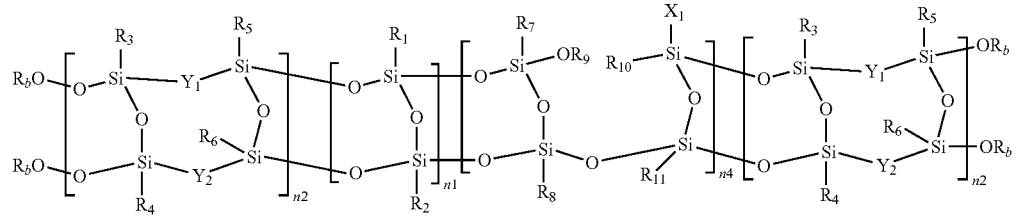

[Formula 6]

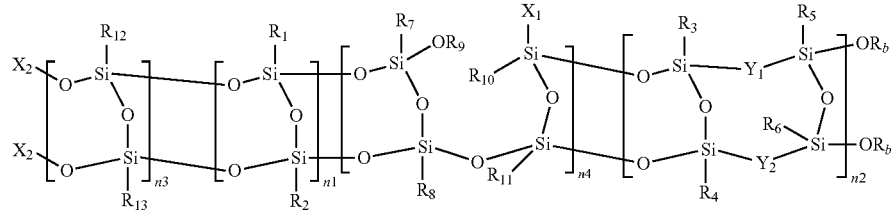

[Formula 7]

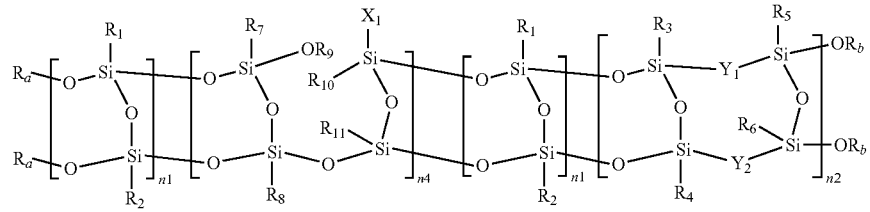

[Formula 8]

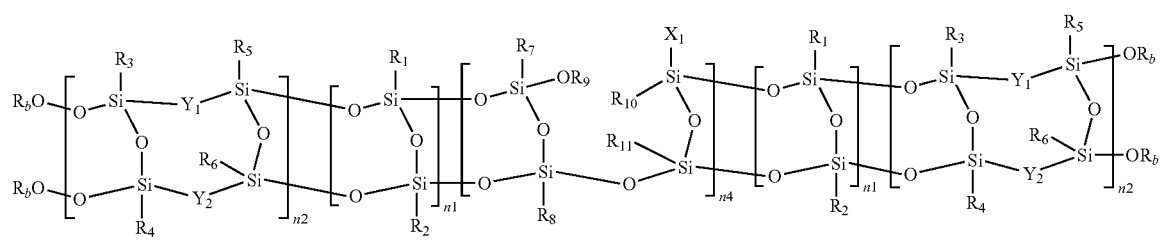

[Formula 9]

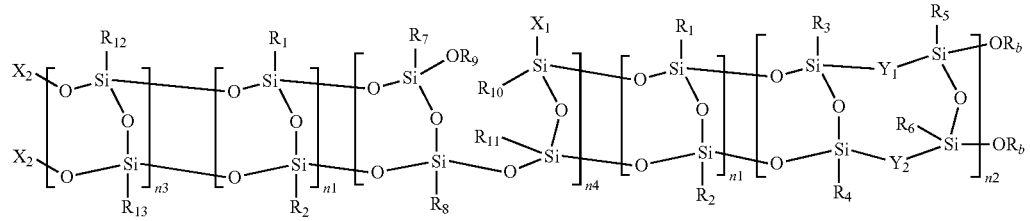

wherein in Formulas 4 to 9, $Y_1$ and $Y_2$ are each independently O, $NR_{20}$, or $[(SiO_{3/2}R_{21})_{4+2n}O]$, at least one of $Y_1$ and $Y_2$ is $[(SiO_{3/2}R_{21})_{4+2n}O]$, $X_1$ and $X_2$ are each independently $R_{22}$ or $[(SiO_{3/2}R_{23})_{4+2n}O]$, at least one of $X_1$ and $X_2$ is $[(SiO_{3/2}R_{23})_{4+2n}O]$, $R_{20}$ to $R_{23}$ are each independently a substituted or unsubstituted alkyl group of 1 to 12 carbon atoms, n and n' are each independently an integer from 1 to 20, $R_a$ to $R_c$ are each independently a substituted or unsubstituted alkyl group of 1 to 12 carbon atoms, n1 and n2 are each independently an integer from 1 to 100,000, n3 is 1 or 2, n4 is an integer from 1 to 500, $R_1$ to $R_7$, $R_9$, $R_{10}$, $R_{12}$, and $R_{13}$ are each independently a hydrogen atom, a deuterium atom, a halogen atom, an isocyanate group, a nitrile group, a nitro group, a substituted or unsubstituted epoxy group, a substituted or unsubstituted acryl group, a substituted or unsubstituted thio group, a substituted or unsubstituted alkyl group of 1 to 12 carbon atoms, a substituted or unsubstituted alkoxy group of 1 to 40 carbon atoms, a substituted or unsubstituted alkenyl group of 2 to 12 carbon atoms, a substituted or unsubstituted aryl group of 6 to 12 carbon atoms, or a substituted or unsubstituted heteroaryl group of 2 to 12 carbon atoms, $R_8$ and $R_{11}$ are each independently a deuterium atom, a halogen atom, an isocyanate group, a nitro group, a substituted or unsubstituted aryl group of 6 to 12 carbon atoms, or a substituted or unsubstituted heteroaryl group of 2 to 12 carbon atoms, and $R_1$ and $R_{12}$ are different from each other.

* * * * *